(12) United States Patent
Kurihara et al.

(10) Patent No.: US 7,915,055 B2
(45) Date of Patent: Mar. 29, 2011

(54) MANUFACTURING METHOD OF SEMICONDUCTOR DEVICE

(75) Inventors: Masaru Kurihara, Kawasaki (JP); Masaru Izawa, Hino (JP); Junichi Tanaka, Hachioji (JP)

(73) Assignees: Hitachi, Ltd., Tokyo (JP); Renesas Electronics Corporation, Kanagawa (JP)

( * ) Notice: Subject to any disclaimer, the term of this patent is extended or adjusted under 35 U.S.C. 154(b) by 352 days.

(21) Appl. No.: 11/693,776

(22) Filed: Mar. 30, 2007

(65) Prior Publication Data

US 2007/0238204 A1 Oct. 11, 2007

(30) Foreign Application Priority Data

Apr. 7, 2006 (JP) ................... 2006-106538

(51) Int. Cl.
*H01L 21/66* (2006.01)
*G01R 31/26* (2006.01)
(52) U.S. Cl. ............ 438/14; 257/E21.521; 257/E21.529
(58) Field of Classification Search .................... 438/14; 257/E21.521, E21.529
See application file for complete search history.

(56) References Cited

U.S. PATENT DOCUMENTS

| 4,890,239 | A | * | 12/1989 | Ausschnitt et al. | 430/30 |
| 6,166,801 | A | * | 12/2000 | Dishon et al. | 355/27 |
| 6,706,543 | B2 | * | 3/2004 | Tanaka et al. | 438/14 |
| 7,291,849 | B1 | * | 11/2007 | Baiocchi et al. | 250/491.1 |
| 2002/0033945 | A1 | * | 3/2002 | Xu et al. | 356/369 |
| 2007/0187595 | A1 | * | 8/2007 | Tanaka et al. | 250/307 |

FOREIGN PATENT DOCUMENTS

| JP | 2002-151465 | 5/2002 |
| JP | 2002-231596 | 8/2002 |
| JP | 2003-531491 | 10/2003 |
| JP | 2005-510083 | 4/2005 |
| JP | 2006-089841 | 4/2006 |
| WO | WO 01/80306 A3 | 10/2001 |

(Continued)

OTHER PUBLICATIONS

Rice et al., "The limits of CD metrology", Mar. 2006, Microelectronic Engineering 83 pp. 1023-1029.*

(Continued)

*Primary Examiner* — Walter L Lindsay, Jr.
*Assistant Examiner* — Leonard Chang
(74) *Attorney, Agent, or Firm* — Antonelli, Terry, Stout & Kraus, LLP.

(57) ABSTRACT

The present invention provides a manufacturing technique of a semiconductor device that reduces fluctuation of electric characteristic and a working size of a semiconductor device and can manufacture semiconductor devices at high quality and at high yield. In a semiconductor device manufacturing system, a control method for a manufacturing process of a semiconductor device having a function (a data collecting unit) of collecting examination data at a plurality of examining steps including an examining step of setting a length of a measurement region in a wiring direction to at least 10 times a wire width to measure the wire width and an examining step of examining the wire width, a function (a data analyzing unit) of generating a prediction model of electric characteristic or working size of a semiconductor device using the examination data to generate a control model from the prediction model, and a function (a process control unit) of properly controlling processing conditions for a control process based upon examination data of the plurality of examining steps in the manufacturing process of a semiconductor device and the control model is realized.

10 Claims, 17 Drawing Sheets

FOREIGN PATENT DOCUMENTS

WO WO 03/044851 A2 5/2003

OTHER PUBLICATIONS

Atsuko Yamaguchi et al.; Metrology of LER: influence of line-edge roughness (LER) on transistor performance; Metrology, Inspection, and Process Control for Microlithography XVIII; pp. 468-476; Proceedings of SPIE vol. 5375 (SPIE, Bellingham, WA, 2004).

Beverly Cheung et al.; Application of Optical CD for Characterization of 70nm Dense Lines; Metrology, Inspection, and Process Control for Microlithography XIX; pp. 30-40; Proc. of SPIE vol. 5752 (SPIE, Bellingham, WA, 2005).

Vladimir A. Ukraintsev et al.; The role of AFM in semiconductor technology development: the 65 nm technology node and beyond; Metrology, Inspection, and Process Control for Microlithography XIX; pp. 127-139; Proc. of SPIE vol. 5752 (SPIE, Bellingham, WA, 2005).

* cited by examiner

AFTER LITHOGRAPHY STEP

AFTER GATE ELECTRODE WORKING STEP

MANUFACTURING METHOD OF SEMICONDUCTOR DEVICE

CROSS-REFERENCE TO RELATED APPLICATION

The present application claims priority from Japanese Patent Application No. JP 2006-106538 filed on Apr. 7, 2006, the content of which is hereby incorporated by reference into this application.

TECHNICAL FIELD OF THE INVENTION

The present invention relates to a manufacturing technique of a semiconductor device, and in particular to a technique suitable for application to a size measuring method of a wire width in a control method for a manufacturing process of a semiconductor device.

BACKGROUND OF THE INVENTION

Recently, according to advance of miniaturization of a size of a semiconductor device, accuracy becomes such severe that a gate electrode with a size of 0.1 μm or less must be worked with a size accuracy of 10% or less. For example, a size of a gate electrode is one of main factors determining an operation characteristic of a semiconductor device, a working size of the gate electrode is influenced by not only a working step of the gate electrode but also a step performed prior to the working step thereof, such as a film thickness of the gate electrode or size of a resist pattern serving as a mask applied during working. Therefore, even if gate electrodes are worked according to the same working step under the same processing condition, working sizes of the gate electrodes do not become the same value due to accumulation of fine fluctuations in respective steps, where a size fluctuation occurs in a certain range, for example, a size fluctuation of about 10 nm at 3σ occurs to 90 nm which is a target value of a working size of a gate electrode. Therefore, the size accuracy deteriorates, which results in decline of productivity.

A scheme for suppressing size fluctuation by predicting size fluctuation from examination data at respective steps and performing proper modification of a processing condition for a control process, has been proposed to overcome the problem.

For example, a method for modifying the processing condition for a control process is shown in Patent Document 1 (Japanese Patent Application Laid-Open Publication No. 2005-510083 (Domestic Publication after PCT International Publication)). In the Patent Document 1, a first process is performed on a semiconductor wafer, and integrated measurement data relating to the process is acquired. A method for specifying at least one error from the integrated measurement data and performing an adjusting process to a second process for compensating for the error has been disclosed.

Another example has been shown in Patent Document 2 (Japanese Patent Application Laid-Open Publication No. 2003-531491 (Domestic Publication after PCT International Publication)). In the Patent Document 2, a step of working a workpiece and a step of outputting a feature parameter from the measured feature parameter using a transistor model are described. A method using a step of predicting a wafer electric test using the output step, a step of detecting a process including a defect based upon the prediction value, and a step of correcting the process including a defect has been disclosed.

A method for controlling a size of a device isolation region according to a feedforward is described in Patent Document 3 (Japanese Patent Application Laid-Open Publication No. 2002-151465). In the Patent Document 3, a method in which a model equation of a step between surfaces of the device isolation region and an active region is generated, then, a cleaning time for removing an embedded oxide film is controlled by the model equation using film thickness measurement data measured after CMP (Chemical Mechanical Polishing), and as a result, the step is controlled to be constant, is disclosed.

On the other hand, in a recent lithographic technique, in order to respond to fineness of a wire width, a light source wavelength is shortened and resist material is changed along with the shortening. As shown in Non-Patent Document 1 (A. Yamaguchi, et al., "Proceedings of SPIE vol. 5375", p. 468-476 (2004)), particularly in resist material responding to an ArF excimer laser of a light source wavelength of 193 nm (hereinafter, "ArF resist"), fluctuation of the wire width such as called "Line Edge Roughness (LER)" becomes significant. The fluctuation of the wire width is about 6 nm at 3σ. Therefore, in a size measurement of a wire width, even on the same wire, when wire widths at different portions are measured, a problem arises that sizes measured are different. Accordingly, in a size examining step in a manufacturing step of a semiconductor device using a resist pattern with large LER, a problem occurs that measurement accuracy for a size deteriorates. And, a method for measuring a fine wire width in a range of 0.1 μm or less with high accuracy and at a high speed is required.

Several methods for measuring a wire width have been proposed in these circumstances. One of the methods is a measuring method of a wire width using a critical dimension-scanning electron microscope (CD-SEM) most widely used currently. The feature of the CD-SEM is that an image with a high resolution can be acquired even if a wire width is 0.1 μm or less and any object to be measure can be measured because the CD-SEM uses an electron beam. It is generally known that the ArF resist is shrunk due to electron beam irradiation, and an amount of the shrink depends on an irradiation amount of electron beam. However, the latest CD-SEM has a function of minimizing the shrink amount for each object to be measured by automatization of measurement and a function (Rectangular Scan) of reducing a shrink amount by expanding a scan interval of electron beam (Rectangular Scan). The Rectangular Scan function allows acquisition of an image with a difference in magnification between a vertical direction and a horizontal direction by changing the scan interval of electron beam. The measuring method of a wire width based upon the CD-SEM has a feature that it is relatively fast and measurement with high accuracy can be performed to arbitrary object to be measured.

As another method, there is a method using scatterometry as shown in Non-Patent Document 2 (B. Cheung, et al., "Proceedings of SPIE vol. 5752", p. 30-40 (2005)). This method acquires interference waveforms of light to a pattern having cyclic arrangement over a square region with a size of 50 μm or more. And, by comparing an interference waveform simulated from a structure model to be measured and an interference waveform acquired actually, a size of an object to be measured is measured in this method. The measuring method of a wire width using scatterometry has a feature that, for the structure model having a simple structure for simulation as described above and a restrictive pattern having cyclic arrangement over a square region with a size of 50 μm or more, measurement can be performed at a relatively high speed.

As still another method, there is a measuring method of a wire width by a Critical Dimension-Atomic Force Microscope (CD-AFM) using Atomic Force Microscope as shown in Non-Patent Document 3 (V. A. Ukraintsev, et. al., "Proceedings of SPIE vol. 5752", p 127-139 (2005)). This method is a method for measuring a wire width using a fine probe to directly measure an object to be measure in a three-dimensional manner. And, since the object to be measured is directly measured, a three-dimensional structure of the object can be grasped. The accuracy of the measurement largely depends on a size of an object to be measured and a shape and a size of the probe.

As described above, in the manufacturing process of a semiconductor device, the methods for controlling a working size of a semiconductor device or the method for measuring a fine object to be measured with a high accuracy have been proposed.

SUMMARY OF THE INVENTION

Recently, in advancement of miniaturization of a size of a semiconductor device, to response to severe requirements for miniaturization of a gate electrode such as 0.1 μm or less and working accuracy such as 10% or less, it is difficult to realize the required working accuracy by only increase in working accuracy at individual working steps. And, the working size of the gate electrode is influenced by not only a size of lithography serving as a mask during etching but also a film thickness of material constituting the gate electrode or work result of a Shallow Trench Isolation (STI) working module on a further upstream side. That is, information about a layer that is positioned below a film to be worked is required. Therefore, a Feed Forward (FF) control according to a model equation using measurement data such as sizes and thicknesses of a plurality of layers, and the like is required.

On the other hand, in a manufacturing step of a recent semiconductor device where a wire width of a gate electrode is 0.1 μm or less, ArF lithography using a light source wavelength of 193 nm becomes mainstream, and resist material for ArF is used. On a pattern exposed using the ArF resist, fluctuation of a wire width called "Line Edge Roughness (LER)" becomes significant, and the fluctuation of a wire width is about 6 nm at 3σ. Therefore, in size measurement of a wire width, when wire widths at different portions on the same wire are measured, such a problem occurs that respective sizes measured are different, which results in deterioration of measurement accuracy. Since a main factor of the fluctuation of a wire width is the resist material, even if further miniaturization of the wire size is achieved hereinafter, fluctuation of the wire width seems to be hardly reduced. That is, in the conventional measuring method, accuracy of size measurement, for example measurement of the wire width, is insufficient, which results in deterioration in accuracy of a model equation used for the FF control. As a result, deterioration of the size measurement accuracy caused by the LER is a very critical problem for management and control of a manufacturing process of a semiconductor device.

Therefore, in order to work a fine shape, for example, of a gate electrode, with a high accuracy, FF control according to a model equation based upon data about plural layers and a size measuring method with a high accuracy without influence of LER has are required.

If the control methods described in Patent Document 1 and Patent Document 2 are applied to the manufacturing process of a semiconductor device using a resist pattern with the large LER described above, accuracy of a model and a correcting step determined by the model deteriorate because of insufficiency of the measurement accuracy of a wire width so that it becomes difficult to obtain a sufficient effect. And, if a control method of a step between an active region and a device isolation region using a model equation described in Patent Document 3 is applied to control on a wire width such as that of a gate electrode, a problem of measurement accuracy for a wire width still arises, therefore, the control method is insufficient for controlling a wire width.

As a method for improving measurement accuracy for a wire width, it is also effective to increase the number of measurement points. However, the increase in the number measurement point reduces throughput at a examining step and causes significant increase of data amount for controlling a manufacturing step, which results in increase in calculation load. Therefore, from the point of view of productivity, to increase in the number of measurement point is not a good method necessarily.

And, in the case where the above-mentioned scatterometry is used as a measuring method of a wire width, a relatively simple pattern constituted by cyclic arrangement over a square region with a size of 50 μm or more, for example, a line and space pattern can be measured at a high speed. However, the restricted pattern such as described above can be measured, but it is impossible to recreate an irregular shape such as discriminating LER on ArF resist. And, if a device isolation region is present as a base, a model for simulating an interface waveform becomes complicated, which results in deterioration of measurement accuracy. Furthermore, in a manufacturing step of a semiconductor device, a wire width that is to be actually controlled is that of a gate electrode in a circuit portion such as a logic portion or an SRAM (static random access memory). On such a circuit pattern, there is a device isolation region, and the pattern of the gate electrode is not a simple cyclic pattern such as a line and space pattern necessarily. Therefore, data obtained by measurement using scatterometry which can measure only a restricted pattern is insufficient for use in establishment of a predicted model of a wire width that is to be controlled actually, such as a wire width of a gate electrode on a circuit portion.

And, in the case where the CD-AFM is used as the measuring method of a wire width, arbitrary measurement pattern can be directly measured in a three-dimensional manner, a wire width that is to be controlled actually, such as a width of a gate electrode on a circuit portion can be measured. However, due to the configuration of an apparatus, its throughput is extremely low and it requires frequent maintenances such as exchange of probes. Therefore, from the point of view of productivity of a semiconductor device, it is not a good method necessarily to use size examination data obtained from the CD-AFM.

And, in the case where the CD-SEM is used as the measuring method of a wire width, it is possible to measure a structure including a device isolation region as a base or arbitrary measurement pattern including an irregular arrangement with a high accuracy. However, when a resist pattern such as ArF resist is measured, the ArF resist is shrunk due to electron beam irradiation. At an examining step, in order to eliminate influence of the shrink, different portions on the same wire are generally measured at an examining step for a wire width after lithography and after the wire is worked using a resist pattern. However, even if different portions on the same wire are measured, the same size is not obtained necessarily due to influence of LER of the ArF resist. And, though it is possible to reduce a shrink amount of the ArF resist by using the Rectangular Scan function, accuracy of measurement data is largely depends on how to set a magnitude of the function or a measurement region.

As described above, several methods for controlling a working size of a semiconductor device have been disclosed, but in a manufacturing process of a semiconductor device using a resist pattern where a wire width is 0.1 μm or less and the LER is large, accuracy of a prediction model deteriorates due to degradation of measurement accuracy of the wire width. Therefore, by a trial for controlling a working size of an object to be controlled based upon the prediction model, a sufficient effect can not be obtained. And, new measuring method has been proposed according to miniaturization of a wire width, but a measuring method with accuracy enough to be used in a prediction model for controlling a manufacturing process of a semiconductor device is not examined sufficiently.

An object of the present invention is to provide a manufacturing technique for a semiconductor device that can reduce fluctuation of electric characteristic and a working size of a semiconductor device to manufacture the semiconductor device with high quality and with high yield. Specifically, by reducing measurement error at a size examining step, generating a model equation based on measurement data in reduced number, size measuring method with a high accuracy, and measurement data such as sizes or film thicknesses of plural layers obtained using the measuring method, and using an FF control method using the model equation, a control method of manufacturing step for semiconductor device with reduced size fluctuation is realized.

The above-mentioned and other objects and new features of the present invention will become apparent from the description of the specification and accompanying drawings.

Outlines of representative inventions of the inventions disclosed in the present application will be explained briefly as follows.

In order to improve measurement accuracy of a wire width in a manufacturing process of a semiconductor device, the present invention realizes a manufacturing method of a semiconductor device by establishing a control system for the manufacturing process of a semiconductor device having a function of collecting examination data at a plurality of examining steps including an examining step of setting a length of a measurement region in a wiring direction to at least 10 times a wire width to measure the wire width and an examining step of examining the wire width, a function of generating a prediction model of electric characteristics or working size of a semiconductor device using the examination data, a function of generating a control model from the prediction model, and a function of properly controlling processing conditions for a control process based upon examination data of the plurality of examining steps in the manufacturing process of the semiconductor device and the control model, and using the control system.

That is, the manufacturing method of a semiconductor device according to the present invention has features such as described below.

(1): The manufacturing method of a semiconductor device is composed of a plurality of processing steps of working a semiconductor device and a plurality of examining steps of examining working results at the respective processing steps, the method comprising a step of collecting examination data at the examining steps of examining a plurality of layers; a step of analyzing the examination data for the plurality of layers; a step of generating a prediction model of a parameter from the examination data of the plurality of layers to at least one parameter of discriminating parameters of the semiconductor device; a step of utilizing at least one processing step of the plurality of processing steps to produce a control model for determining at least one set value of a processing condition of the control process in order to stabilize the parameters of the semiconductor device; a step of calculating a set value of the processing condition for the control process from the examination data of the plurality of layers based upon the control model; and a step of changing the processing condition for the control process based upon the calculated set value.

(2): The manufacturing method of a semiconductor device of the above (1) generates either one of a prediction model of wire width of a gate electrode of the semiconductor device, a prediction model of size of an offset spacer of the gate electrode of the semiconductor device, and a prediction model of threshold voltage of a transistor of the semiconductor device, as the prediction model.

(3): The manufacturing method of a semiconductor device of the above (1) comprises a step of calculating a step between an active region and a device isolation region which is a discriminating size of the semiconductor device from the examination data at the plurality of examining steps, wherein the step between the active region and the device isolation region is set as one of parameters of the prediction model.

(4): The manufacturing method of a semiconductor device of above (1) comprises a step of examining a resist pattern using a Critical Dimension-Scanning Electron Microscope, wherein a shrink amount of the resist pattern is set as one of parameters of the prediction model.

(5): In the manufacturing method of a semiconductor device of the above (1), either one of a pattern occupancy, a processing time after maintenance of an apparatus, a processing order for a wafer to be processed, and a wafer placement position within a batch processing apparatus for a wafer to be processed, is used as one of parameters of the prediction model.

(6): The manufacturing method of a semiconductor device of above (1) comprises a step of examining a wire width, wherein a length of the measurement region in a wiring direction is 1 μm or more, and a wire width to be measured is 0.1 μm or less.

(7): The manufacturing method of a semiconductor device of above (1) comprises a step of examining a wire width, wherein a wire width is measured from a measurement image whose magnification in a wire direction is 150,000 times or less and whose magnification in a lateral direction is 100,000 times or more obtained using a Critical Dimension-Scanning Electron Microscope.

(8): The manufacturing method of a semiconductor device of above (1) comprises a step of examining a wire width, wherein size measurement data used in generating the prediction model is measured using a Critical Dimension-Scanning Electron Microscope and a scatterometry, and control parameter is determined using size measurement data measured by the scatterometry.

(9): The manufacturing method of a semiconductor device of above (1), comprises a step of examining wire widths before processing at one working step and after processing thereat, wherein a portion of measurement positions before the processing and after the processing coincide with each other with accuracy of an error of 0.5 μm or less.

(10): In the manufacturing method of a semiconductor device of the above (1), comprises either one of an examining step for stress measurement, an examining step for impurity concentration, an examining step for film thickness, and an examining step for electric characteristic of the semiconductor device, as one of the examining steps.

(11): The manufacturing method of a semiconductor device of the above (1) comprises a step of calculating a discriminating size of the semiconductor device from the examination data of the plurality of examining steps, wherein the discriminating size is set as one of the parameters of the prediction model.

(12): In the manufacturing method of a semiconductor device of the above (1), wherein an average value for each lot, an average value obtained by taking out at least one of the lot to measure the same, an average value for each wafer, and an average value for each chip is used as the examination data at the examining steps.

(13): In the manufacturing method of a semiconductor device of the above (1), wherein either one of a processing condition for the control process of each processing lot obtained by calculating a value of a control parameter for each processing lot, a processing condition for the control process of each wafer to be processed obtained by calculating a value of a control parameter for each wafer to be processed, and a processing condition for the control process of each chip on a wafer to be processed obtained by calculating a value of a control parameter for the chip is changed as the changing of the processing condition for the control process.

(14): The manufacturing method of a semiconductor device of the above (1) comprises a step of producing at least two prediction models, and a step of producing at least two control models to determine at least two control parameters for the control process.

(15): The manufacturing method of a semiconductor device of the above (1) comprises a step of examining the wire width, wherein an average value of a plurality of wire widths is utilized as a measurement value.

(16): The manufacturing method of a semiconductor device of the above (1) comprises a step of examining wire widths before and after a processing at one working step, wherein a portion where measurement positions before and after the processing coincide with each other with accuracy of error of 0.5 μm or less and data processing is performed such that a difference between two edge profiles of the measured wire becomes minimal, so that a size of a portion where the two edge profiles coincide with each other is utilized as the examination data.

The present invention can be applied to a semiconductor manufacturing system for implementing the manufacturing method of a semiconductor device of the above (1) to (16), a semiconductor device manufactured using the semiconductor manufacturing system, and the like.

Effects obtained by representative inventions of the inventions disclosed in the present application will be briefly explained below.

According to the present invention, three effects can be mainly expected. The first effect lies in that measurement accuracy of a wire width is improved so that accuracy of a prediction model can be improved. By controlling a control process appropriately using the model with high accuracy, high working accuracy can be realized and finally, productivity of a semiconductor device can be improved. The second effect lies in that the measurement accuracy of a wire width is improved so that a prediction model can be maintained in a sufficiently high accuracy as compared with the conventional measuring method, even if the number of measurement points is reduced. Therefore, high working accuracy can be realized without deteriorating throughput at examining steps, and finally, productivity of a semiconductor device can be improved. The third effect lies in that the degree of influence of each step to a working size of object to be controlled can be calculated from a prediction model with a high accuracy. It can be determined that a step where the degree of influence is large is a main factor causing size fluctuation. Thus, a step to be managed carefully in the manufacturing process of a semiconductor device can be extracted from the prediction model of the present invention.

BRIEF DESCRIPTIONS OF THE DRAWINGS

DESCRIPTIONS OF THE PREFERRED EMBODIMENTS

Embodiments of the present invention will be explained below in detail with reference to the drawings. In all figures for explaining the embodiments, same members are attached with same reference symbols in principle and repetitive explanation thereof will be omitted.

Outline of Embodiments of the Present Invention

Figure 1:
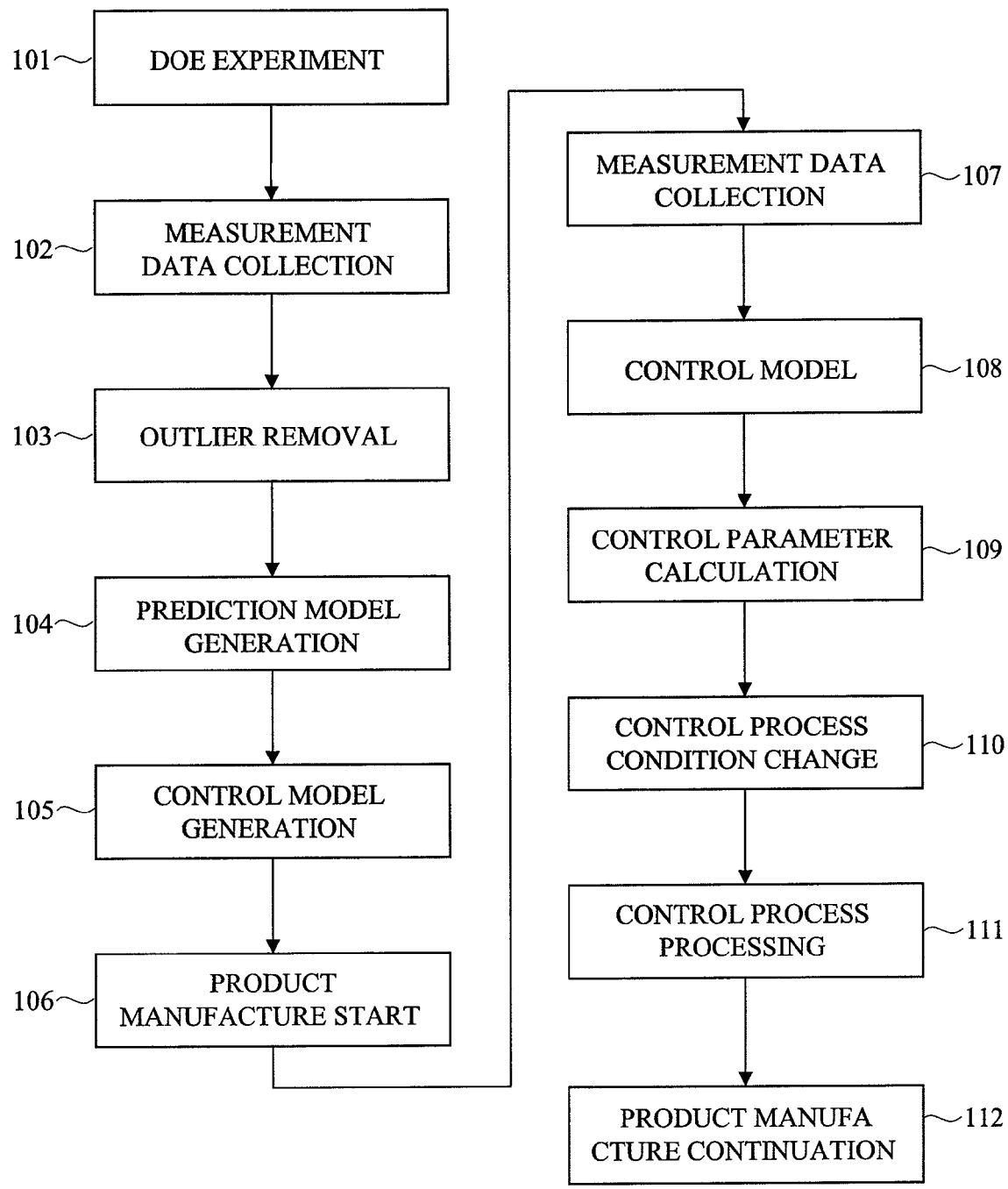
FIG. 1 is a diagram showing a work flow in a manufacturing method of a semiconductor device in an embodiment of the present invention.

An outline of embodiments of the present invention will be explained with reference to FIG. 1 and FIG. 2. FIG. 1 is a diagram showing a working flow in a manufacturing method of a semiconductor device and FIG. 2 is a diagram showing a configuration of a semiconductor manufacturing system.

In an embodiment of the present invention, first, processing conditions for a proper processing step is intentionally changed by design of experiment (DOE) such that working sizes to be controlled are varied (101) in a work flow in a manufacturing method of a semiconductor device, as shown in FIG. 1. This is for enhancing effects in the respective processing steps to the working sizes. Next, measurement data in respective examining steps are collected and outliers are removed (102, 103). Thereafter, a prediction model (a prediction model equation) is generated using the measurement data (104). Then, a control model (a control model equation) for calculating a control parameter in a control process is generated from the prediction model and set values of the working size to be controlled (105). Next, a production manufacturing process is actually started (106). Measurement data at the examining step just before the control process is collected to be delivered to the control model (107, 108). Then, the control parameter is calculated from the control model equation and the processing condition at the control process is changed based upon the control parameter (109, 110). The control process is processed and the manufacturing process subsequent is then continued (111, 112).

Figure 2:
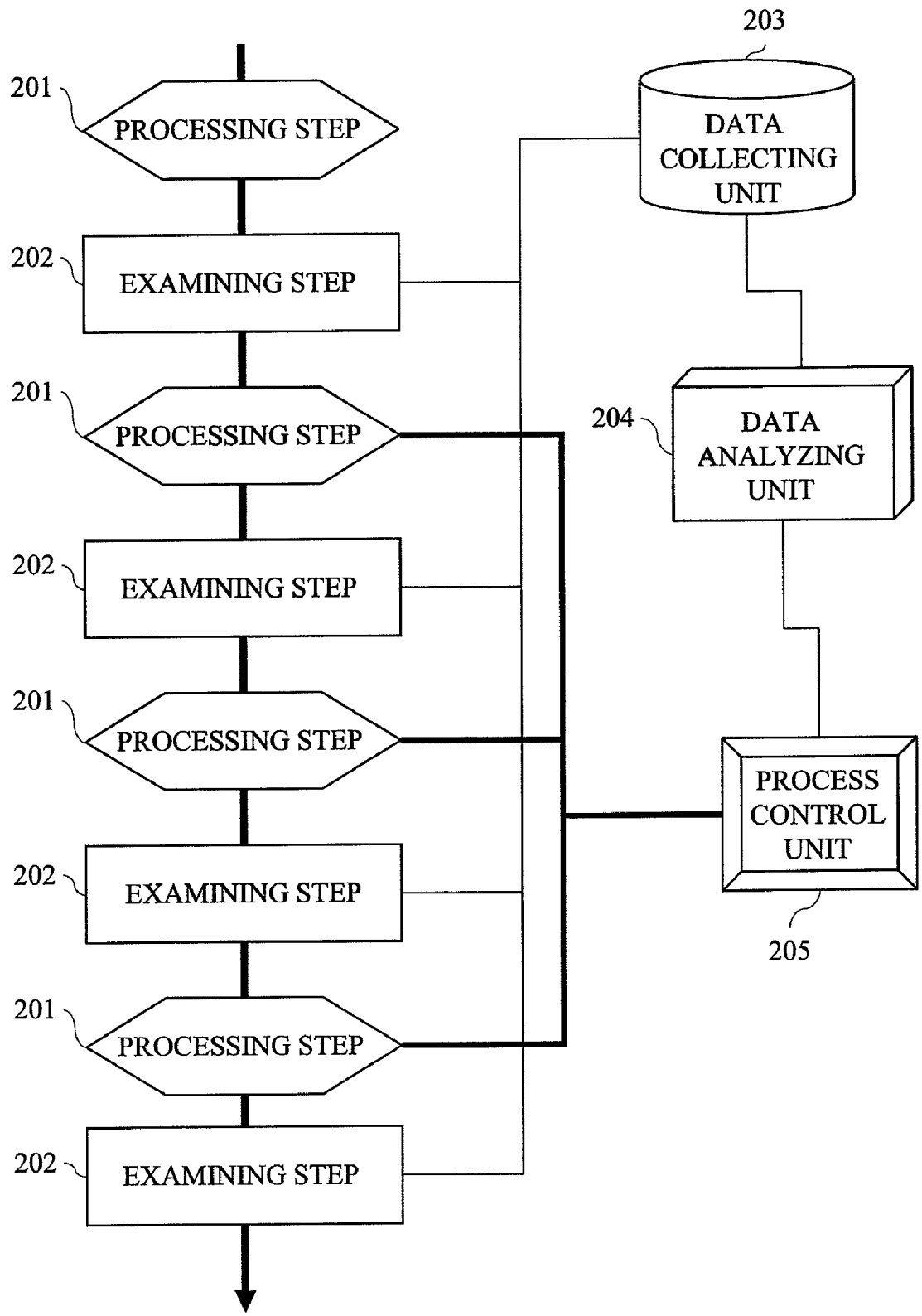
FIG. 2 is a diagram showing a configuration of a semiconductor device manufacturing system in the embodiment of the present invention.

Next, a configuration of a semiconductor manufacturing system in the manufacturing line is shown in FIG. 2. A wafer to be processed is processed sequentially at processing steps 201 shown in FIG. 2. Arrow in FIG. 2 represents a flow of the wafer to be processed. Among the processing steps 201, examinations of a film thickness of a formed film, a working size, and the like are performed at a plurality of examining steps 202. In a mass production line, several examinations are generally performed to a plurality of lots, but it is preferable that the examinations are performed to all lots and all wafers. It is also possible to examine at least one wafer for each lot by deputy. The examination data is transmitted to a data collecting unit 203. In a data analyzing unit 204, statistical processing such as outlier removal, calculation of average value for each wafer, or calculation of average value for each lot is performed to the examination data obtained from the data collecting unit 203, and a prediction model and a control model are produced by main component analysis, multiple regression analysis or the like. In a process control unit 205, the control parameter at the control process is determined from the examination data using the control model, and the control parameter is transmitted to the control process, so that the processing condition at the control process is changed automatically. It is desirable that respective units are configured using individual computers, but they may be constructed as an integrated server. With such a system configuration, it becomes possible to control the working size of the object to be controlled of the semiconductor device with a high accuracy.

First Embodiment

Figure 3:
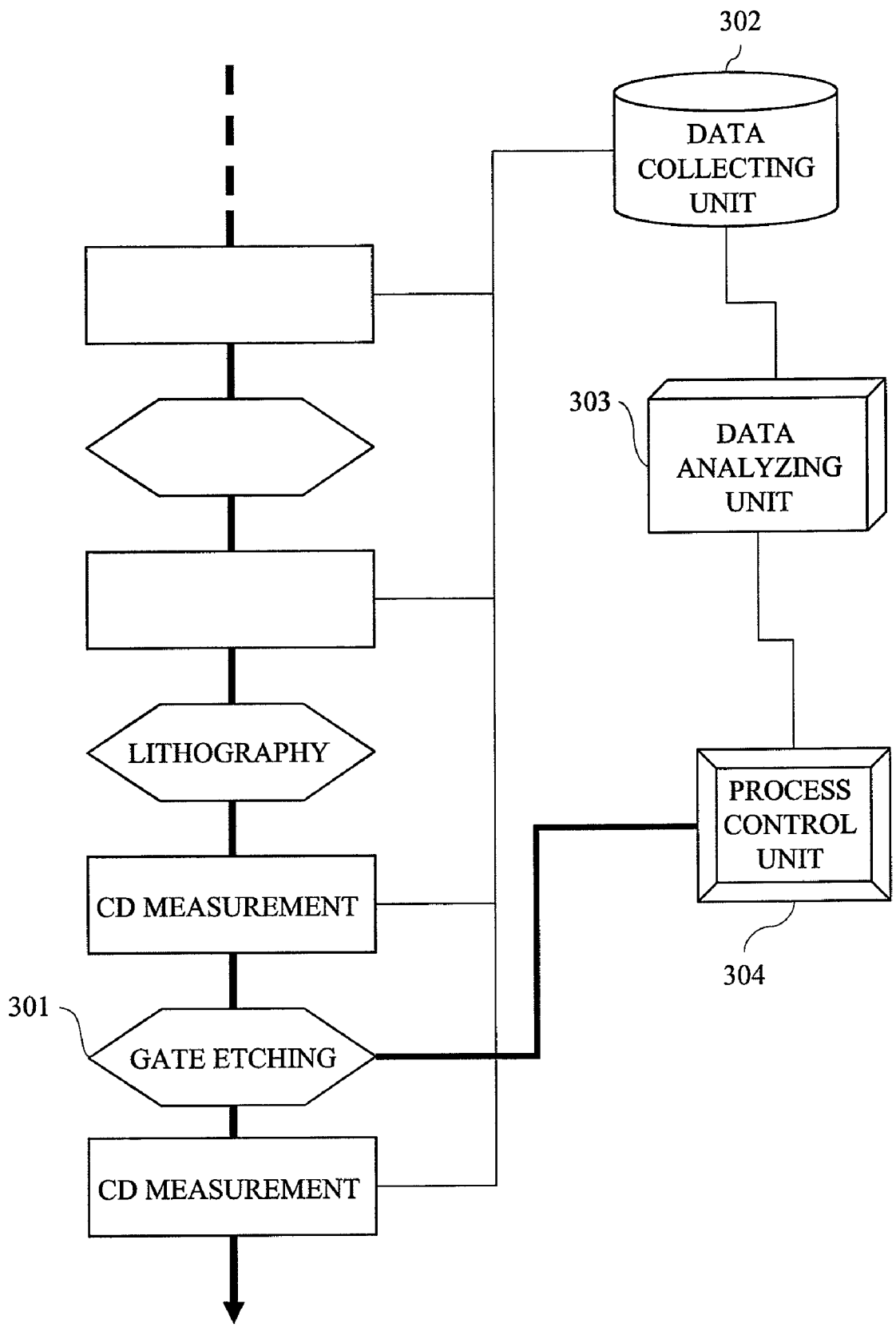
FIG. 3 is a diagram showing a control system of a wire width of a gate electrode in a first embodiment of the present invention.
Figure 4:
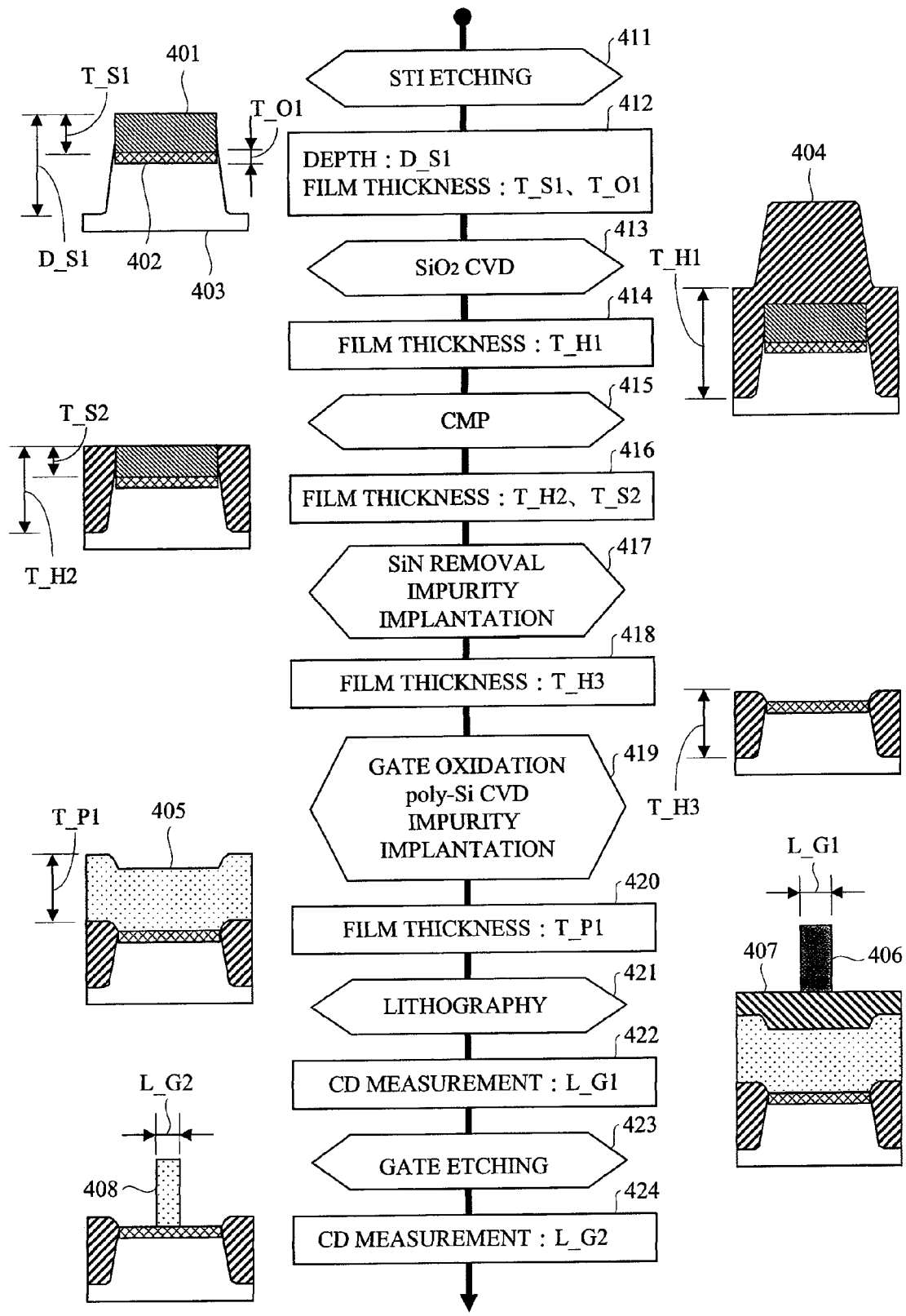
FIG. 4 is a diagram showing a process flow up to gate etching step in the first embodiment of the present invention.
Figure 5:
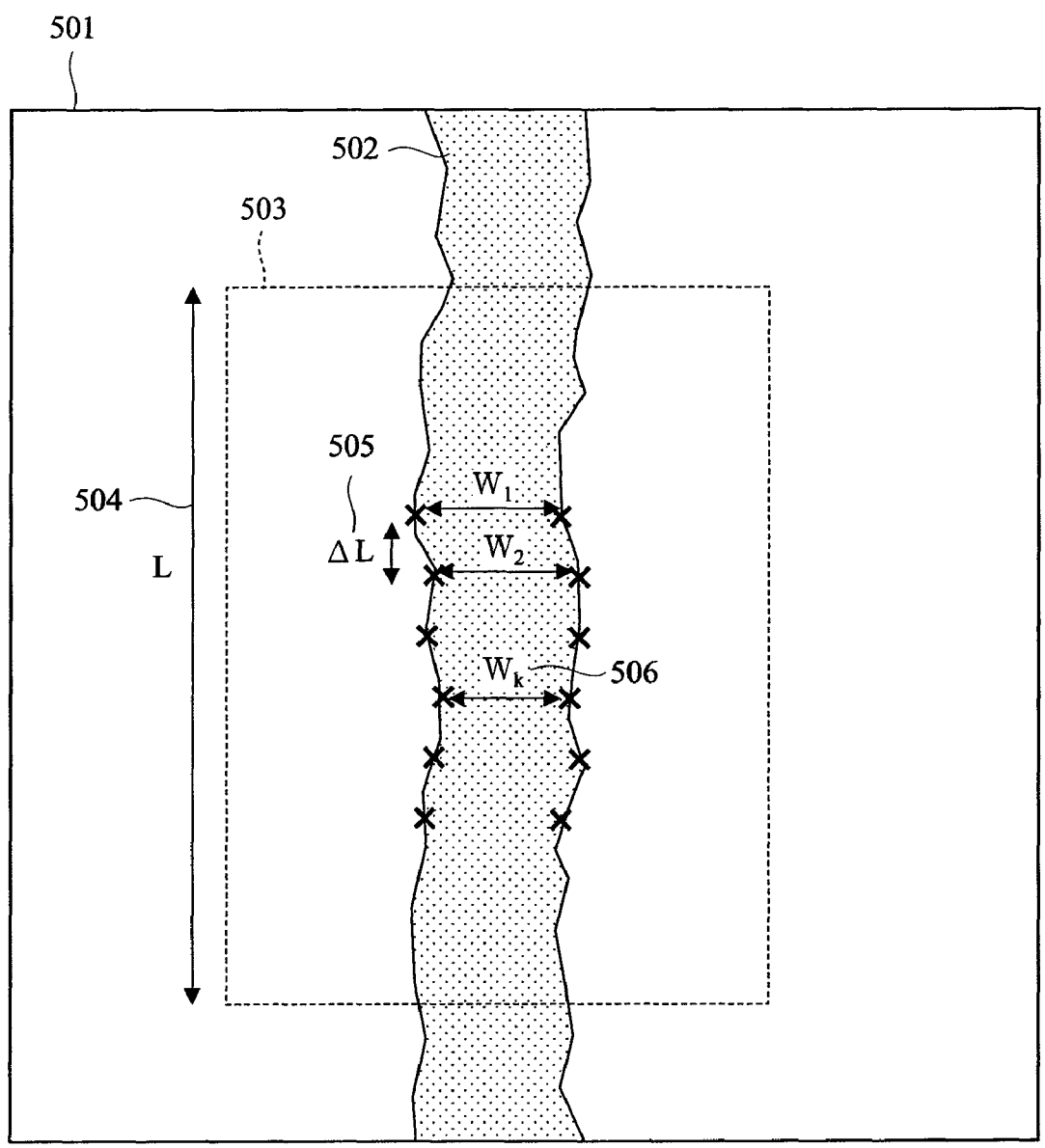
FIG. 5 is a diagram showing a measurement image obtained by a CD-SEM in the first embodiment of the present invention.
Figure 6:
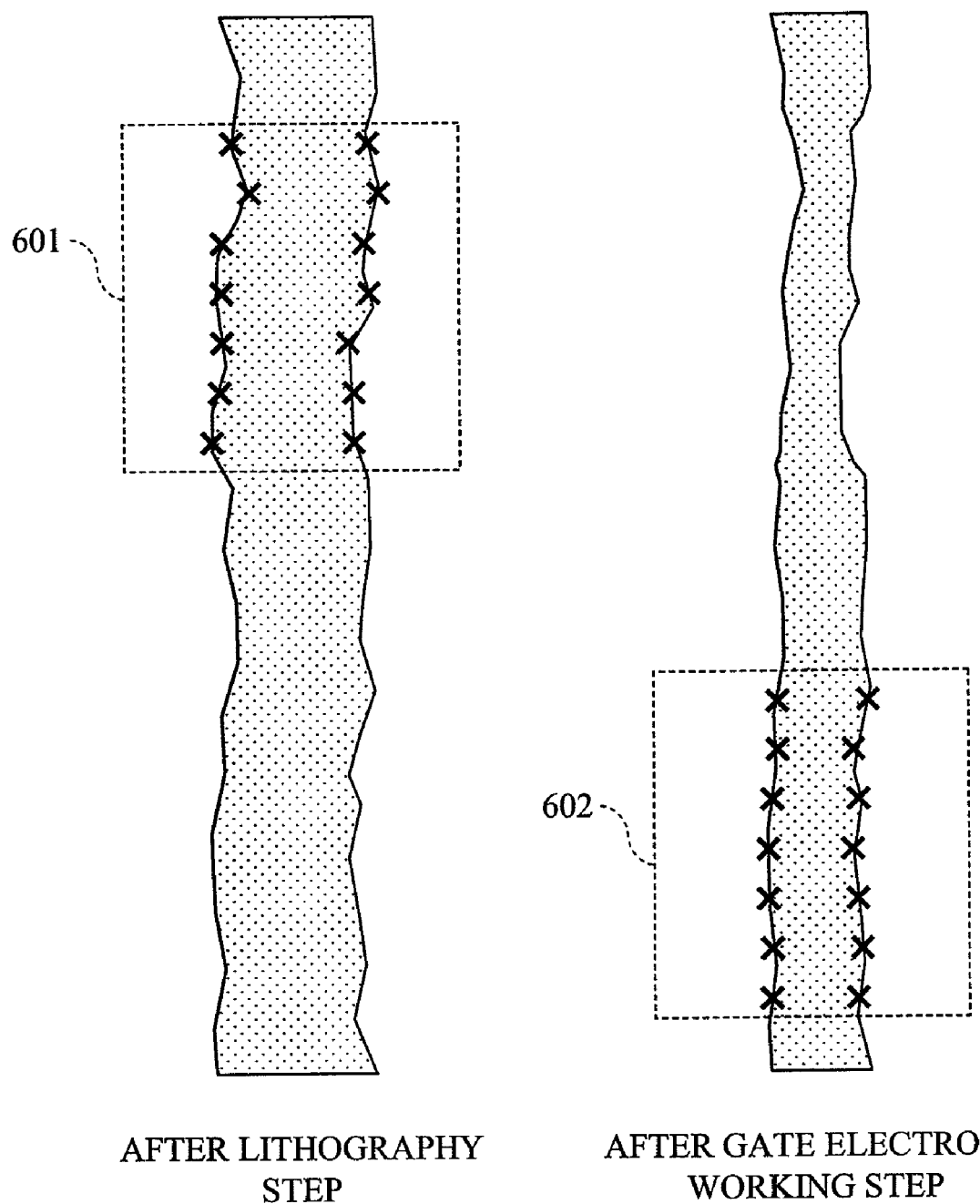
FIG. 6 is a diagram showing an example of measurement of wire width in the first embodiment of the present invention.
Figure 7:
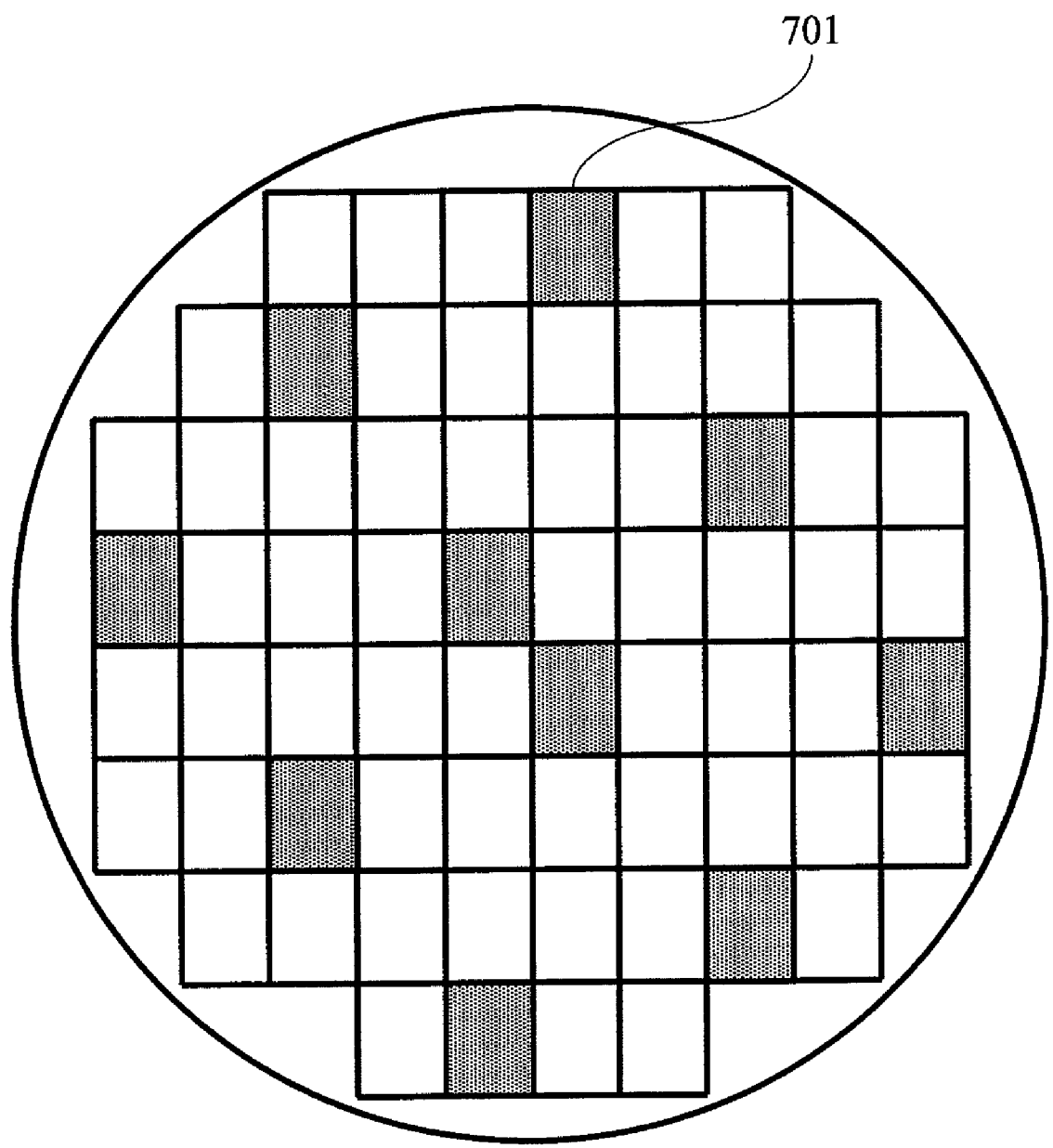
FIG. 7 is a diagram showing a measurement portion of wafer in-plane.
Figure 8A:
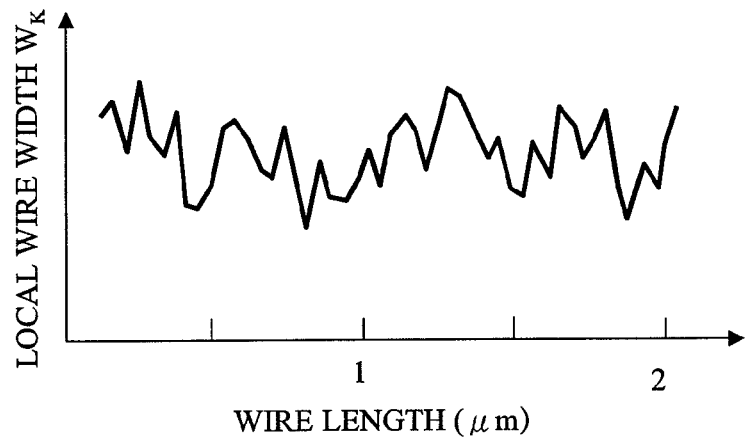
FIG. 8A is a diagram showing a relationship between a length of a measurement region and measurement accuracy in the first embodiment of the present invention (a wire length—local wire width)
Figure 8B:
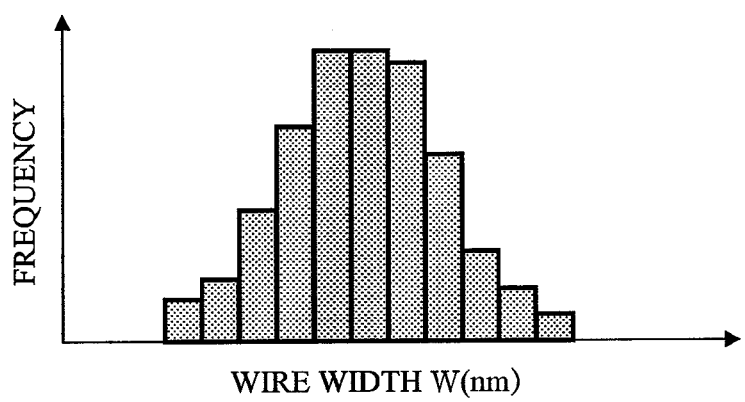
FIG. 8B is a diagram showing a relationship between a length of a measurement region and measurement accuracy in the first embodiment of the present invention (a wire width—frequency)
Figure 8C:
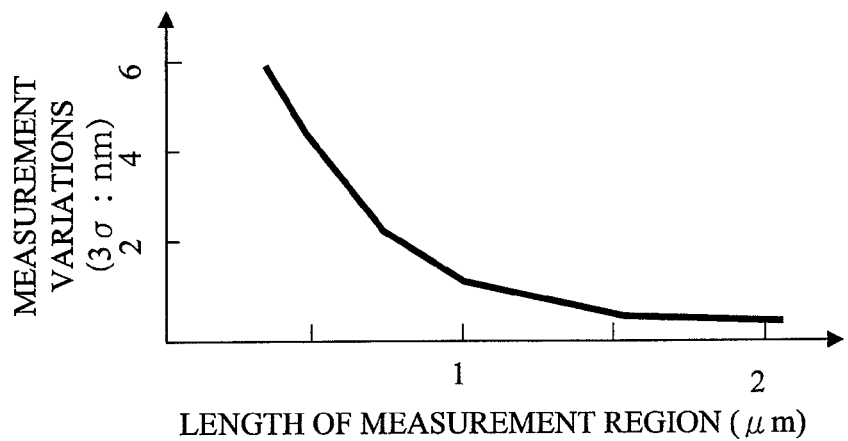
FIG. 8C is a diagram showing a relationship between a length of a measurement region and measurement accuracy in the first embodiment of the present invention (a length of a measurement region—measurement variations)
Figure 9:
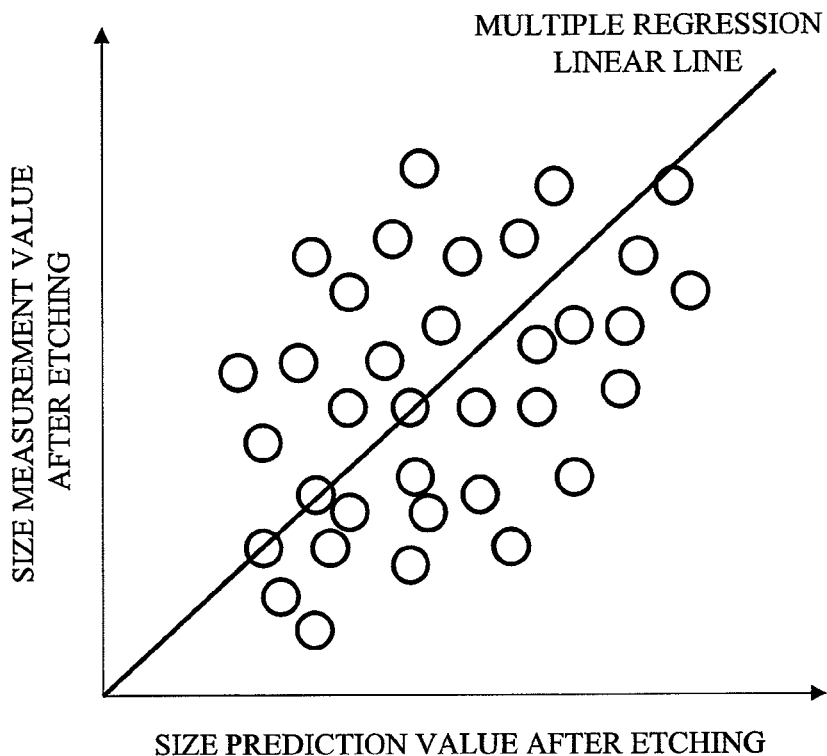
FIG. 9 is a diagram showing correlation between actually measured values and prediction values of a gate electrode wire width according to a conventional measuring method in comparison with the first embodiment of the present invention.
Figure 10:
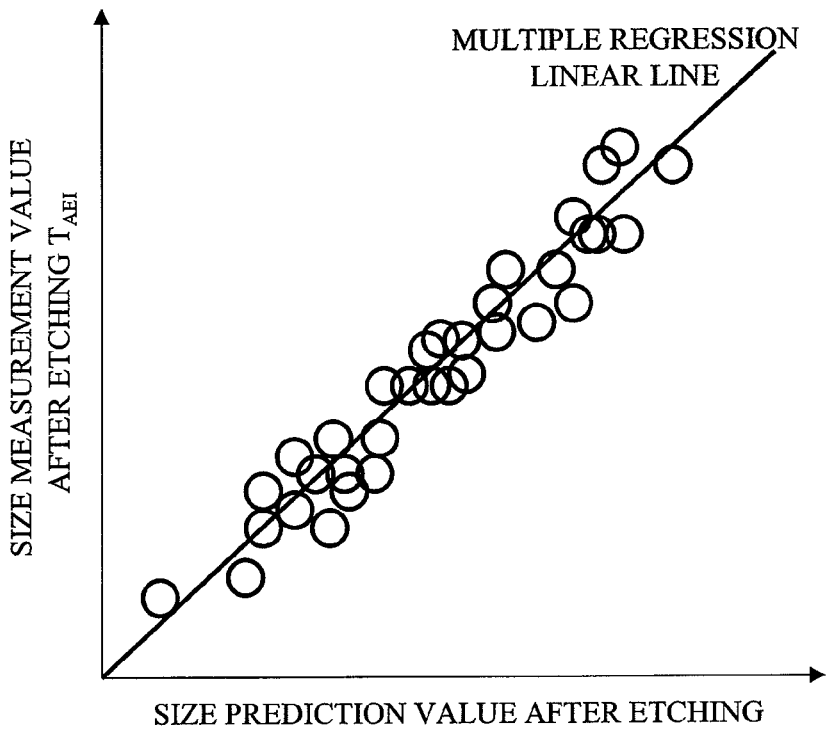
FIG. 10 is a diagram showing correlation between actually measured values and prediction values of a gate electrode of a gate electrode wire width obtained in the case where the first embodiment is used.
Figure 11:
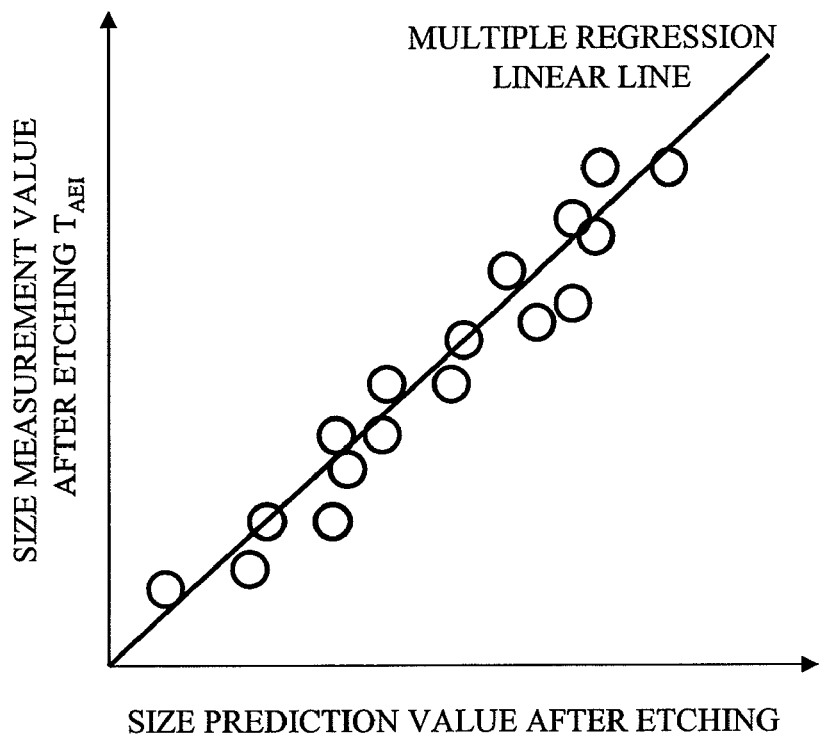
FIG. 11 is a diagram showing correlation between actually measured values and prediction values of a gate electrode of a gate electrode wire width obtained in the case where the number of data points has been reduced using the first embodiment.
Figure 12:
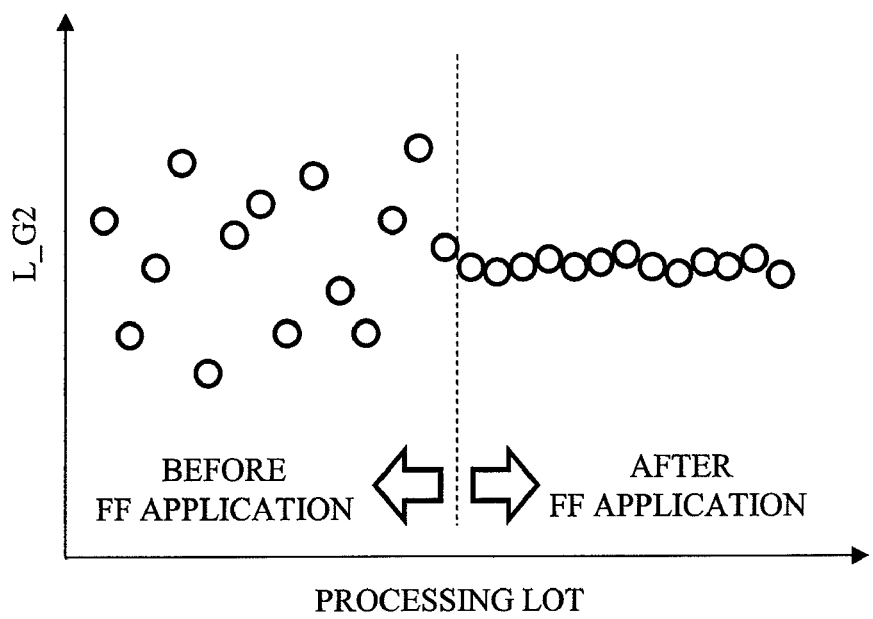
FIG. 12 is a diagram showing an FF control result of the gate electrode wire width in the first embodiment of the present invention.
Figure 13:
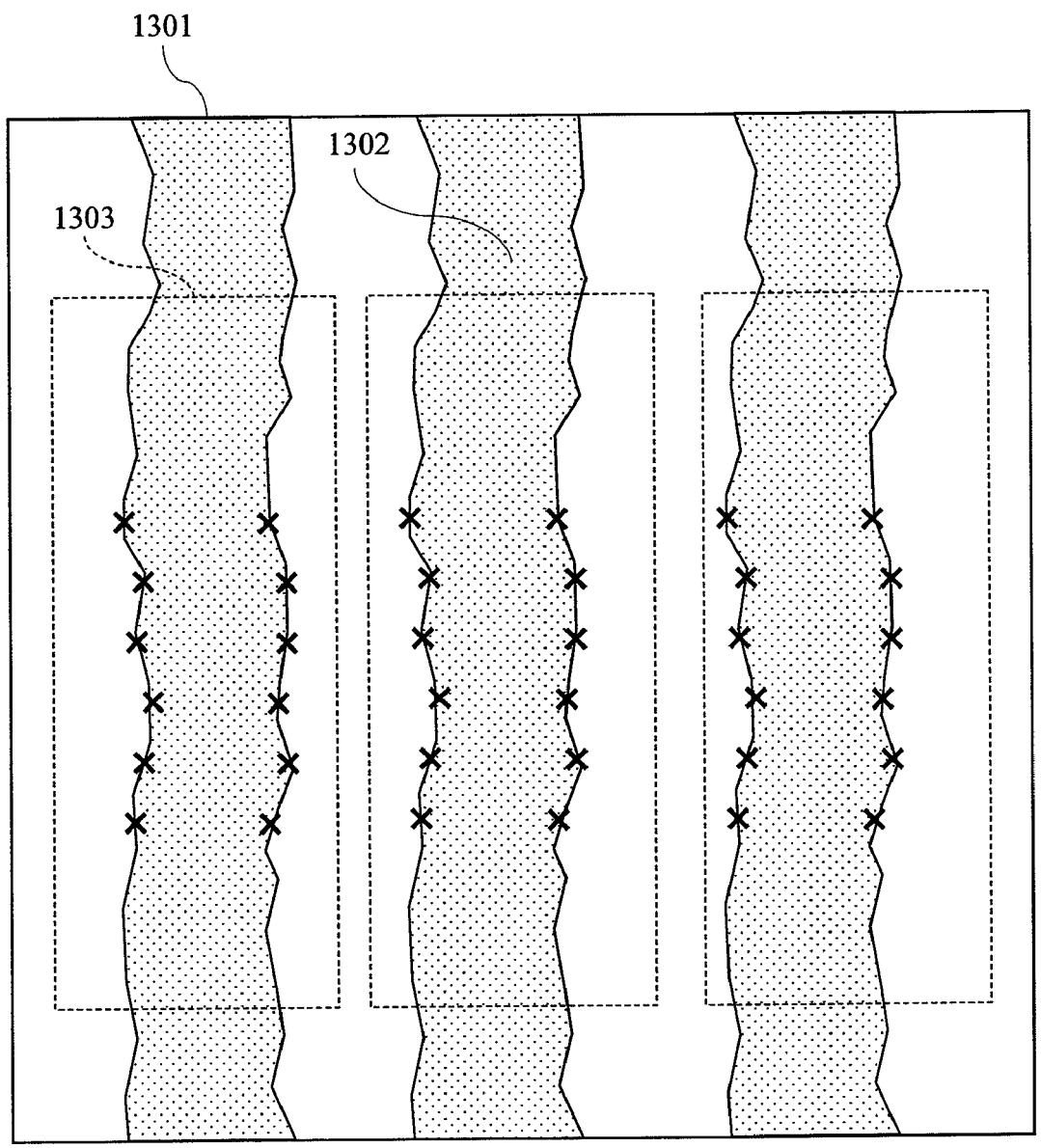
FIG. 13 is a diagram showing an example of wire width measurement obtained in the case where a plurality of patterns are present within a measured image in the first embodiment of the present invention.
Figure 14A:
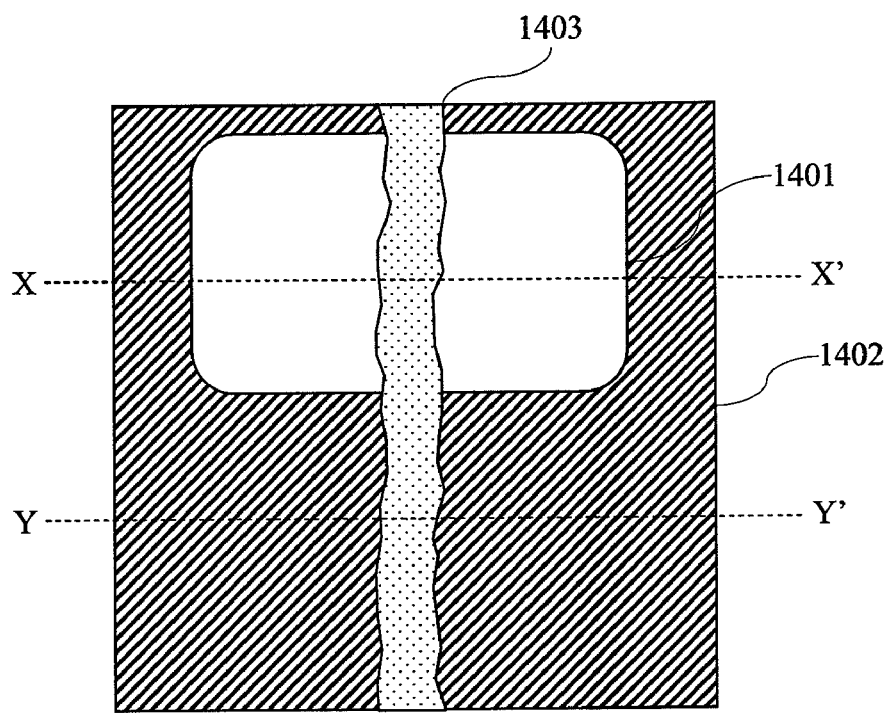
FIG. 14A is a plan view of a gate electrode in the first embodiment of the present invention.
Figure 14B:
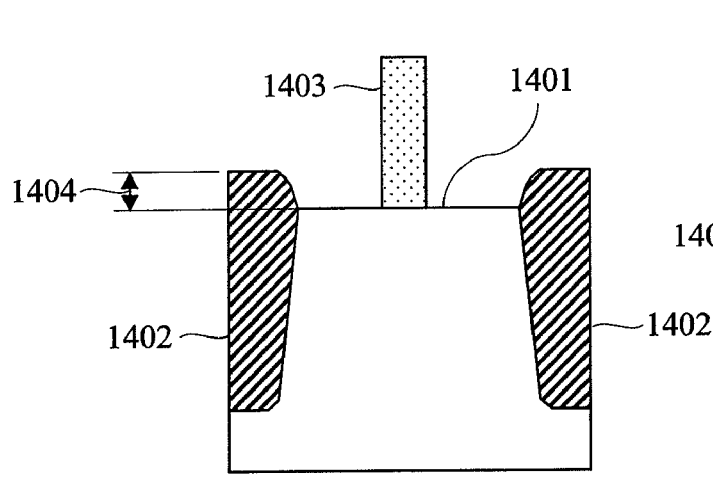
FIG. 14B is a sectional view of the gate electrode in the first embodiment of the present invention.
Figure 14C:
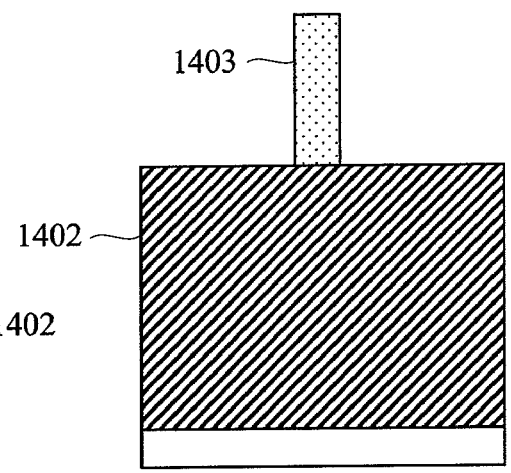
FIG. 14C is a sectional view of the gate electrode in the first embodiment of the present invention.
Figure 15:
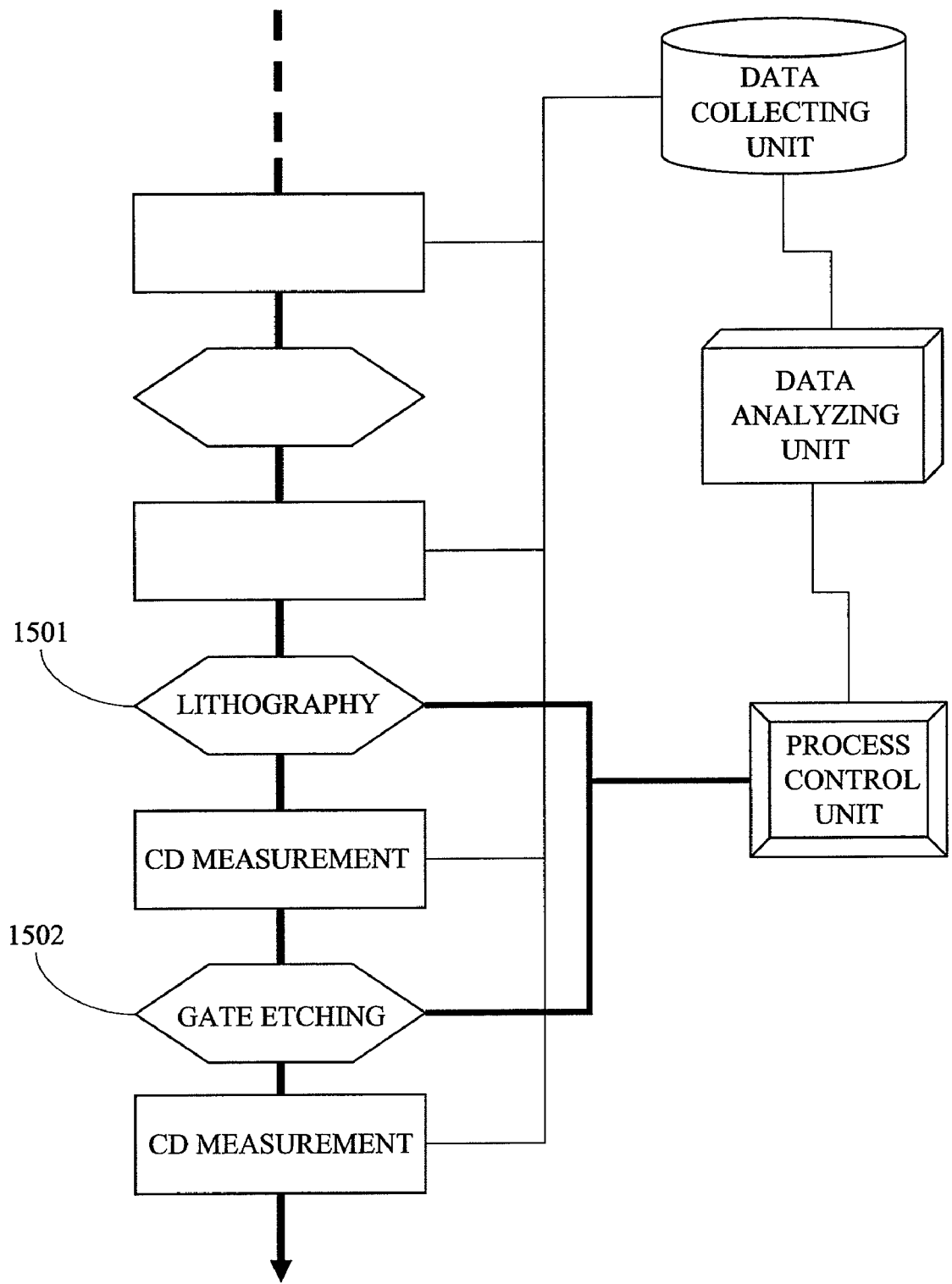
FIG. 15 is a diagram showing a control system in the case where a plurality of control processes are present in the first embodiment of the present invention.

A first embodiment of the present invention will be explained with reference to FIG. 3 to FIG. 15. FIG. 3 shows a control system of a wire width of a gate electrode, FIG. 4 shows a process flow up to gate etching, FIG. 5 shows a measured image of a CD-SEM, FIG. 6 shows examples of measurement of a wire width, FIG. 7 shows a measured portion of wafer in-plane, FIG. 8A to FIG. 8C show relationships between a length of a measurement region and measurement accuracy, FIG. 9 shows correlation between actually measured values and prediction values of a gate electrode wire width according to a conventional measuring method, FIG. 10 shows correlation between actually measured values and prediction values of a gate electrode wire width in the case where the embodiment is used, FIG. 11 shows correlation between actually measured values and prediction values of a gate electrode wire width in the case where the number of data points is reduced using the embodiment, FIG. 12 shows an FF control result of a gate electrode wire width, FIG. 13 shows an example of wire width measurement obtained in the case where a plurality of patterns are present within a measurement image, FIGS. 14A and 14B are a plan view and a sectional view of a gate electrode, and FIG. 15 shows a control system in the case where a plurality of control processes are present.

An example where the present invention has been applied to control on a wire width of a gate electrode is shown. In the embodiment, as shown in FIG. 3, a gate etching step 301 is performed as a control process and an anti-reflection film etching time is utilized as a control parameter. A more detailed process flow is shown in FIG. 4. After ST1 etching step, a depth D_S1 from a silicon nitride 401 surface on a silicon substrate 403, a film thickness T_S1 of silicon nitride, and a film thickness T_O1 of silicon oxide 402 are measured (411, 412). Thereafter, silicon oxide 404 is deposited, ST1 is embedded, and a film thickness T_H1 thereof is measured (413, 414). Next, a wafer surface is planarized by CMP, and a film thickness T_S2 of the silicon nitride 401 and a film thickness T_H2 of the embedded silicon oxide 404 are measured (415, 416). Further, removal of the silicon nitride 401 and impurity implantation are performed, and a film thickness T_H3 of the embedded silicon oxide 404 after film thickness reduction is measured (417, 418). Thereafter, gate oxidation, film formation of polysilicon 405, and impurity implantation are performed, and a film thickness T_P1 of the polysilicon 405 is measured (419, 420). Next, an anti-reflection film 407 and a resist film is formed, and lithography is conducted (421). Thereafter, a size L_G1 of a resist pattern 406 is measured and gate etching is performed (422, 423). A wire width L_G2 of a gate electrode 408 after gate etching is measured (424). In the embodiment, a method for controlling the wire width L_G2 of the gate electrode will be shown.

Firstly, in order to enhance influence of each step to the wire width L_G2 of the gate electrode, processing conditions for five steps including a lithography step were set to two levels, and the steps up to a size examining step of the wire width L_G2 of the gate electrode after gate etching were performed using 16 wafers. That is, this fact corresponds to production of 16 kinds of wafers different in performed step. If processing is performed with constant processing conditions at respective steps, influences of the respective steps to the wire width L_G2 of the gate electrode get lost in temporal changes of respective processing apparatuses or measurement error at examining steps. That is, because of deterioration in SN ratio, a prediction model with high accuracy of a wire width L_G2 of a gate electrode can not be generated. On the other hand, in this embodiment, processing conditions for 5 steps were set to be about ±10% of a specified value, so that the SN ratio could be set to be sufficiently high and a prediction model with a high accuracy can be generated. In order to raise accuracy further, it is effective to increase the number of steps for changing the processing condition and cause the number of wafers to be processed to coincide with the number of all combinations, too. When the processing condition is set to be two or more levels, even if the processing condition is set to be ±3% or more of the specified value, it is possible to construct a prediction model with a sufficiently high accuracy. And, the number of wafers to be processed can be determined properly based upon the DOE. Though it is preferable that the number of wafers is set such that all combinations can be realized, in this embodiment, the number of wafers is set to 16 to increase throughput.

Next, as the respective examining steps, measurement was performed using an interference film thickness meter, an ellipsometry, or the like, in a film thickness examining step. In a size examining step after lithography step and in a size measuring step after the gate working step, measurement images 501 that were different in magnification between a wire direction and a direction perpendicular to the wire direction were acquired using a CD-SEM, as shown in FIG. 5. Next, an average value of local wire widths ($W_k$) 506 measured under a condition that a length (L) of a measurement region 503 to a wire 502 that was an object to be measured was 3 μm and a measurement interval (ΔL) 505 was 10 nm was defined as the wire width W and examination data $L\_G1_f$ and $L\_G2_f$ were obtained. For example, if the wire 502 that is an object to be measured is skewed to an image, it is possible to measure local wire widths more accurately by correcting the skew. In the embodiment, the magnification of an image was set to 35,000 times in a vertical direction and 150,000 times in a lateral direction. In the embodiment, the number of pixels of an image was set to 512 pixels in both the vertical and lateral directions. However, the number of pixels is preferably at least 2048 pixels and more preferably at least 4096 pixels in both the directions. Regarding a size measurement portion 601 after the lithography step and a size measurement portion 602 after the gate working step, different portions spaced by 4 μm on the same wire were measured as shown in FIG. 6. All of 16 wafers were measured at each examining step, and measurement each examining item was performed to chips 701 to be examined at 10 in-plane points on each wafer, as shown in FIG. 7. In the embodiment, a manufacturing process for processing 200 mm wafers is explained. However, in a manufacturing process for processing a wafer with a large diameter such as a diameter of 300 mm or more, a prediction model with a higher accuracy can be constructed by setting the number of in-plane measurement points to equal or more than 10.

Here, a relationship between the length (L) 504 of the measurement region and the measurement accuracy of the wire width W will be explained. In FIG. 8A, the local wire width ($W_k$) 506 measured while setting the measurement interval (ΔL) 505 to 10 nm is shown (the wire length—the local wire width). The measurement interval 505 is preferably 20 nm or less, more preferably 10 nm or less. In FIG. 8B, a histogram of measurement values obtained in measurement of a plurality of portions on the wire while setting the length 504 of the measurement region to 0.3 μm is shown (the wire width—frequency). A standard deviation σ of the histogram is 2 nm. That is, the example of this wire means that there are measurement variations of 6 nm at 3σ in measurement of the measurement region whose length 504 is 0.3 μm. Next, FIG. 8C shows a relationship between the measurement variations and the length 504 of the measurement region (the length of the measurement region—the measurement variations). It is found that the measurement variations are reduced according to elongation of the measurement region 503. In the measurement of the wire width W, it is found that, if the length 504 of the measurement region is set 1 μm, the measurement variations are 1 nm or less at 3σ. From such a fact, it is found that, by setting the length 504 of the measurement region to 1 μm, accuracy of the prediction model can be secured sufficiently, but the length 504 is preferably 2 μm or more, more preferably 3 μm or more. In the relationship between the length 504 of the measurement region and the wire width W, the length 504 of the measurement region is preferred to be 10 times the wire width W, furthermore, it is preferably 20 times the wire width W, more preferably 30 times the wire width W. Therefore, in the embodiment, the length 504 of the measurement region is set to 3 μm in order to further increase the accuracy.

In order to take the length (L) 504 of the measurement region longer, the resolution of an image may be reduced. That is, in order to secure the measurement region with length of 1 μm or more, it is necessary to set the magnification of the image in the vertical direction to 150,000 times or less. The magnification is preferably 100,000 times or less, more preferably 50,000 times or less. However, since the measurement accuracy of the size depends on the resolution of an image, if the resolution of an image is reduced, the measurement accuracy of the wire width W to be actually measured deteriorates. Therefore, it is desirable that the resolution in the wire width direction, namely, the lateral direction, is 150,000 times or more. The resolution is preferably 200,000 times or more, more preferably 300,000 times or more. In order to take the length in the wire direction longer without reducing the resolution in the wire width direction in this manner, the Rectangular Scan function that thins scanning intervals of electron beam in a CD-SEM to acquire an image whose magnification has been made different between the vertical direction and the lateral direction is very effective. Since the function thins the scanning intervals of electron beam, it is not only effective for reducing the shrink amount of ArF resist but also it is an optimal method for acquiring an image with magnification of 150,000 times or more in the lateral direction and 150,000 times or less in the vertical direction. In the embodiment, therefore, the wire width W was measured using the Rectangular Scan function with the magnification in the wire direction of 35,000 times and the magnification in the lateral direction of 150,000 times in a state that the length 504 of the measurement region is 3 μm.

Next, the examination data in the DOE experiment is collected in the data collecting unit 302 and they are analyzed in the data analyzing unit 303, so that a model equation such as Equation (1) is generated, as shown in FIG. 3. In the data analyzing unit 303, measurement data $T_j$ used for a prediction model of Equation (1) were selected based upon a correlation coefficient of two measurement data in order to avoid multi-collinearity of the measurement data $T_j$. A prediction model of L_G1 as Equation (1) was produced using a multiple regression model according to a least-square method while using the size L_G2 after gate working as an objective variable and using the other measurement data $T_j$, L_G1 as an explaining variable in the prediction model. $A_j$ and C in Equation (1) are a coefficient and a constant of the measurement data $T_j$.

$$L\_G2 \text{ prediction value} = A \times L\_G1 + \ldots + A_j \times T_j + \ldots + C \quad (1)$$

At this time, since additional information such as wafer number, in-plane position, or processing order at each step is contained in each measurement data, it is possible to add such a correction item as in-plane distribution or processing order in the prediction model. In this case, the least-square method was used for model production. However, it is also possible to produce a model according to a general multivariate analysis method. It is effective to remove abnormal values in order to increase the accuracy of the model. Using a product $A_j\sigma_j$ of the coefficient $A_j$ of the prediction model and the standard deviation $\sigma_j$ of the measurement data $T_j$, contribution rate of each step to the wire width W of the gate electrode can be calculated. A management value of the step with large contribution rate must be set to be more severe. Thus, the prediction model is effective means for extraction of an important step.

FIG. 9 shows correlation of the prediction value of L_G2 and the measurement value (measured value) based upon the prediction model generated according to the conventional measuring method. As the conventional measuring method, examination data $T_j$ obtained by performing measurement while setting the magnification of an image to 150,000 times and setting the length of the measurement region to 500 nm was used. Since the accuracy of the examination data $T_j$ is low, the correlation between the measurement value L_G2 of the wire width W of the gate electrode and the prediction value according to the model is weak, as a result, the correlation coefficient is 0.8. That is, it means that accuracy of the prediction model is insufficient. Next, the correlation between the prediction value of L_G2 according to the prediction model applied with the embodiment and the measurement value (the measured value) is shown in FIG. 10. In the case where the embodiment was applied to the prediction model, the correlation between a measurement value $T_{AEI}$ of the wire width W of the gate electrode and the prediction value is strong, such a result was obtained that the correlation coefficient was very high such as 0.97. This fact is one of main effects obtained by the embodiment. FIG. 11 shows correlation between the measurement value (the measured value) L_G2 and the prediction value obtained in the case where the number of in-plane measurement points is set to 5. Since the correlation coefficient in this case was 0.95, even if the number of measurement points was reduced, the measurement accuracy was high, so that such a result was obtained that the accuracy of the prediction model was sufficiently high. From this fact, such a merit can be obtained that throughput at the examining steps can be improved by reducing the number of measurement points in application of the embodiment.

Next, the control process is set to gate etching, and a calculation method of an anti-reflection film etching time utilized as a control parameter is shown. It is generally known that the wire width W of the gate electrode lies in a linear relationship with the etching time for the anti-reflection film. Therefore, the control parameter D can be expressed as Equation (2) by deforming the prediction model of Equation (1).

D, $B_j$, and C in Equation (2) are an etching time, and a coefficient and a constant of examination data $T_j$.

$$D = B \times L\_G1 + \ldots + B_j \times T_j + \ldots + C \quad (2)$$

As the control parameter, not only the etching time but also another parameter such as an oxygen addition amount or an RF bias can be controlled in the case where the control process is set to the gate etching step. In the embodiment, however, the etching time with a strong linearity between the parameter and the wire width of the gate electrode was used as the control parameter. In the process control unit 304, the etching time D serving as the control parameter was calculated from the control model of Equation (2) using the examination data $T_j$ of wafers actually flowing in the manufacturing line. The processing was performed with changing the processing condition in the gate etching apparatus operates as the control process using the etching time D. As a result, the size accuracy after the gate electrode working can be suppressed to 1 nm or less at the standard deviation σ, as shown in FIG. 12. In the embodiment, the method for controlling the wire width of the gate electrode to a target value has been described. The wire width of the gate electrode is not determined by only the size of a resist pattern serving as a mask at dry-etching, but it is largely influenced by a film thickness of polysilicon that is a film to be processed or flatness of a surface thereof. Therefore, like the embodiment, by producing a prediction model and a control model using film thickness data of a layer different from the film to be processed, it becomes possible to control the working size with a high accuracy.

In the embodiment, a single wire width W was used as the measurement value. For example, as shown in FIG. 13, in the case where a plurality of wires are present in a measurement image 1301 (reference symbol 1302 denotes a wire to be measured and 1303 denotes a measurement region), even if an average value of the plurality of wire widths W is used as a measurement value, improvement of the measurement accuracy can be expected. And, in the case where a plurality of wires are present on a measurement image and a width of one of the wires is measured, in the ordinary measuring method, one wire is selected according to image automatic recognition and a wire width W thereof is measured. However, a targeted specified wire can not be measured necessarily according to the automatic recognition. Generally, to a wire end, wide pattern for contacting is connected. Therefore, by performing setting so that the wire end is positioned in the measurement image 1301, a specific wire can be extracted from a plurality of wires, and it becomes possible to measure a size of the same pattern consistently.

And, in the embodiment, the wire width W of the gate electrode on a monitor pattern prepared for measurement of the wire width W is utilized as an object to be measured, but in the case where an active region 1401 or a device isolation region 1402 such as shown in FIG. 14A are present, a value of the coefficient $A_j$ of the prediction model Equation shown Equation (1) slightly changes due to influence from a base structure. Therefore, a prediction model can be prepared by setting a wire width W of a gate electrode 1403 on the active region 1401 as shown in FIG. 14B (section taken along line X-X' in FIG. 14A) or a wire width W of the gate electrode 1403 on the device isolation region 1402 such as shown in FIG. 14C (section taken along line Y-Y' in FIG. 14A) as an object to be measured. By producing both prediction models of the monitor pattern and the wire width W of the gate electrode 1403 on the active region 1401, the wire width W of the gate electrode 1403 on the active region 1401 can be predicted from the wire width W of the monitor pattern. And, if a prediction model to the wire width W of the gate electrode 1403 to be controlled and a prediction model produced from data obtained by measuring a simple line and space pattern using a scatterometry are coincident with each other, or if a wire width W of the gate electrode 1403 to be measured can be predicted from measurement data $T_j$ of a scatterometry by introducing a correction coefficient or the like, a scatterometry can be used for size measurement at the size examining step.

And, the monitor pattern is preferably 3 μm or more, more preferably 6 μm or more, as a length in a line direction. It is preferable that such a line and space pattern as extending over a plurality of active regions and device isolation regions is used for measurement instead of the simple line and space pattern. The width of the active region is preferably 0.5 μm or less, more preferably 0.2 μm or less. It is also effective to prepare a complicated circuit pattern such as SRAM on a mask layout for management in advance. At this time, a pattern shape is not required to be the same as that of an actual SRAM necessarily, but it is desirable that characteristic of size fluctuation of the former is equivalent to that of the SRAM.

In the embodiment, the working of a gate electrode of one pattern occupancy has been explained as an example. However, by introducing a prediction model of a gate electrode different in pattern occupancy, the pattern occupancy can be taken in the prediction model, so that application to a manufacturing process in a semiconductor apparatus different in pattern occupancy can be newly made possible.

In the embodiment, the case that the gate etching step is set as the control process has been explained, but it is possible to control a plurality of steps by producing a plurality of control models. For example, as shown in FIG. 15, such a configuration can be possible that a lithography step 1501 is set as a first control process and a gate etching step 1502 is set as a second control process by using examination data including the second control model and L_G1.

Further, in the embodiment, the method for determining the control parameter D for each lot has been shown, and it is preferable that an average value of all wafers in each lot is utilized as examination data delivered to the control model, but it is possible to utilize an average value of at least one wafer in each lot as the examination data. Since additional information such as processing order or in-plane position information is contained in the measurement data $T_j$, it is also possible to determine a control parameter for each wafer or for each in-plane position. Especially, since a scanner type exposing apparatus is mainly used at a current lithography step, it is possible to set an exposure amount for each wafer or for each in-plane position, and more specific size control becomes possible. Generally, processing characteristics of a processing apparatus change according to time elapsing after maintenance. By taking the temporal change of the processing characteristic into the prediction model, a prediction model with higher accuracy can be produced. As a method for detecting the temporal change, it is also possible to analyze examination data $T_j$ relating to the processing step or a method of analyzing log data inherent to the processing apparatus such as electric apparatus data or light emission data of the processing apparatus can be adopted.

In the embodiment, the examination data $T_j$ was directly used as the variable for the prediction model. However, for example, as shown in FIG. 14, an STI (Shallow Trench Isolation) step represented by a difference in surface height between the active region 1401 and the device isolation region 1402 is a discriminative size amount that can be calculated from a plurality of examination data $T_j$. Thus, it is possible to use the discriminative size amount that can be calculated from the plurality of examination data $T_j$ as a variable for a prediction model. Since the discriminative size is easily understandable intuitively as such a shape, it is a very effective approach for engineer's investigation into the cause of size fluctuation.

In order to maintain accuracy of a prediction model consistently, regular verification and reconstruction of the model are indispensable. In the embodiment, the DOE experiment was performed again using a lot with a minimum wafer organization at every maintenance to the apparatus so that reconstruction of the prediction model was performed. As another method, each step is performed periodically at such a cycle as one per thousand wafers without changing the processing condition for the control process, and an error or a difference between the measurement value L_G2 of the wire width of the gate electrode and the prediction value from the prediction model a size to be controlled, for example, about the measurement value L_G2 of the wire width of the gate electrode, is verified. For example, such a management method that, if the error reaches 5% or more, the prediction model is reconstructed, is effective. In such a case that material has been changed or that OPC (Optical Proximity Correction) has been performed on a reticle used at a lithography, the model must be reconstructed. In the case where a plurality of processing apparatuses are present at one processing step or a plurality of examining apparatuses are present at one examining step, such a method that apparatus differences among the apparatuses is corrected in advance or information about the apparatus difference is taken in a prediction model can be adopted.

And, in the embodiment, the example in which the collection of examination data, the generation of production model, the generation of a control model, the calculation of control parameters, and the transmission of the control parameters to the control processes are automatically performed via a network by a computer has been explained. The collection of examination data, the input of the control parameters into the control processes, or the like can be performed manually by an operator.

Second Embodiment

Figure 16:
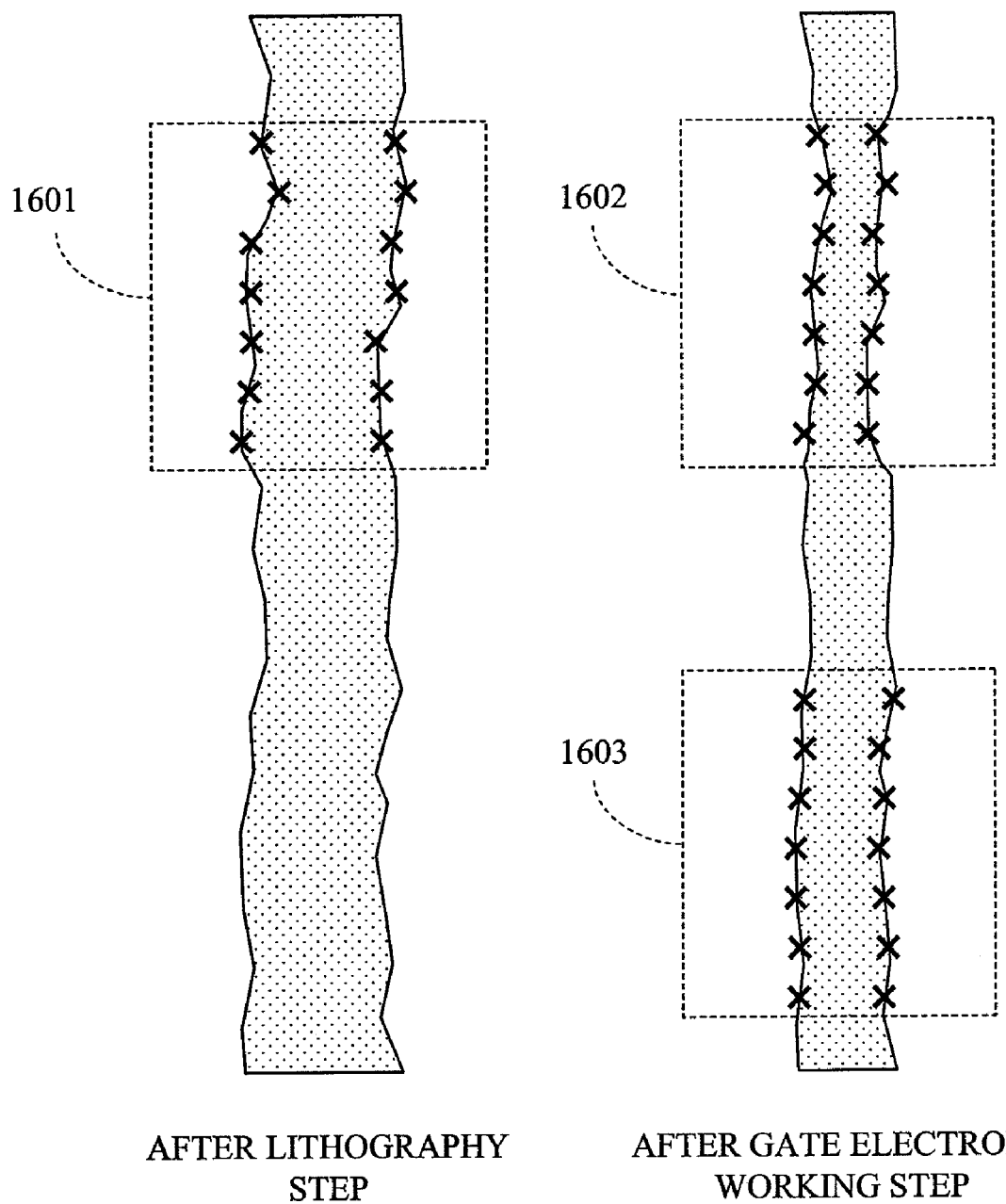
FIG. 16 is a diagram showing an example of measurement of a wire width in a second embodiment of the present invention.
Figure 17A:
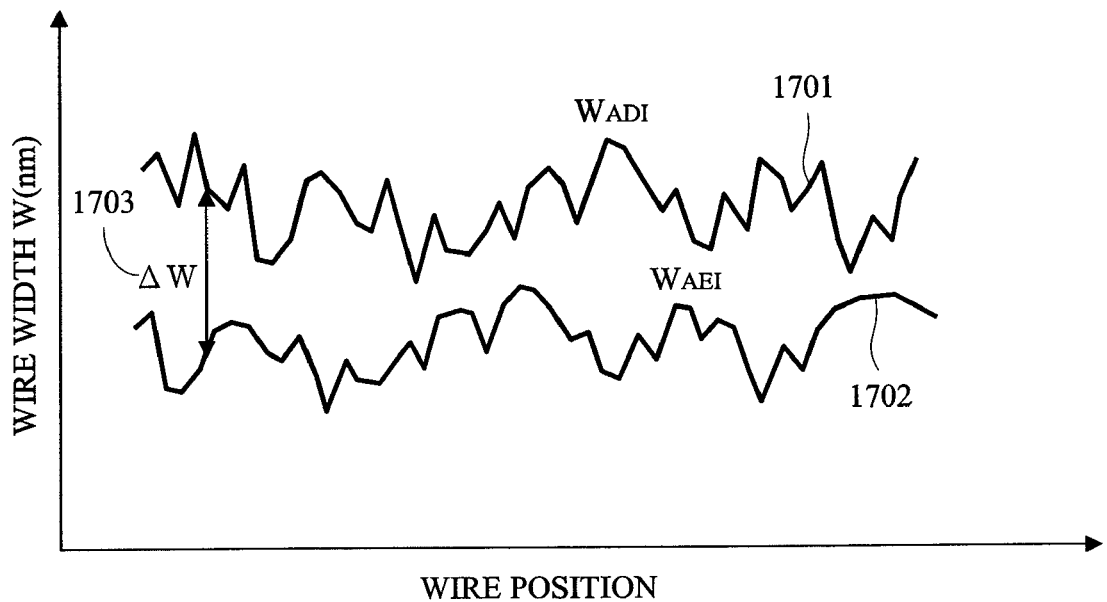
FIG. 17A is a diagram showing a method for specifying the same portion from measurement data in the second embodiment.
Figure 17B:
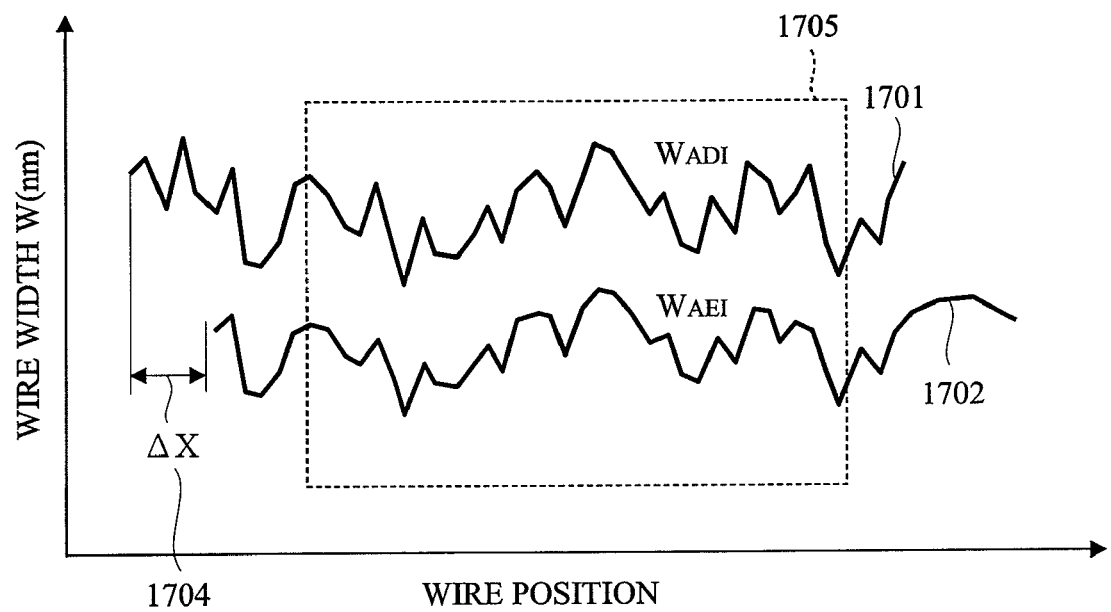
FIG. 17B is a diagram showing the method for specifying the same portion from measurement data in the second embodiment.

A second embodiment of the present invention will be explained with reference to FIG. 5, FIG. 6 described above and FIG. 16, FIG. 17A and FIG. 17B. FIG. 16 shows an example of measurement of wire width, and FIG. 17A and FIG. 17B show a method for specifying the same portion form measurement data.

In the embodiment, as shown in FIG. 16, in size measurement after gate electrode processing, an example that data about the same portion (the same measurement portion after etching as measurement portion after lithography) 1602 as a portion measured at a size measurement after lithography (the measurement portion after lithography) 1601 and different portions with the same pattern (measurement portion after etching different from the measurement portion after lithography) 1603 is used is explained. Here the same portion indicates portion coincident with each other preferably with accuracy of 0.5 μm or less, more preferably with accuracy of 0.2 μm or less in coordinates in a wafer surface specified by the measuring apparatus. In this embodiment, portions coincident with each other with accuracy of 0.1 μm or less were determined as the same portion. According to recent change of resist materials, a resist pattern tends to shrink when size measurement is performed using a CD-SEM. Therefore, in the conventional size measurement, as shown in FIG. 6, a method where different portions with the same pattern are measured after lithography (601) and after gate electrode processing (602) predominates. However, in measurement of a resist pattern, it is apparent that if there is no shrink, accuracy of a model is increased by measuring the same portion. In the embodiment, therefore, the same measurement portion 1602 as the measurement portion 1601 measured at the size measurement after lithography and the measurement portion 1603 different from the measurement portion 1602 with the same pattern are measured in the size measurement after gate electrode processing. As the measuring method, the measurement image 501 whose magnifications in the vertical direction and the lateral direction are different is acquired using a CD-SEM and measurement is performed with the length (L) of the measurement region of 3 μm and the measurement intervals (ΔL) 505 of 10 nm to the wire 502 to be measured, as shown in FIG. 5. Next, using size data L_G1 measured after lithography, size data L_G2 of the same portion as the portion measured at L_G1 after gate electrode processing, and size data L_G2' of a measurement portion different from the portion measured at L_G1, a shrink amount S of a resist pattern caused by electron beam irradiation is calculated as shown by Equation (3).

$$S = L\_G2' - L\_G2 \quad (3)$$

Next, in the prediction model, a size prediction model of size after gate electrode processing is generated using the examination data $T_j$ and the calculated shrink amount S of the resist pattern. By taking the shrink amount S of the resist pattern into the prediction model, model accuracy can be improved. The shrink amount S of the resist pattern depends on an electron beam irradiation time. However, in the case where the size measurement of the resist pattern is performed according to automatic measurement, the electron beam irradiation time becomes constant, so that the shrink amount S can be regarded as a constant. In the embodiment, a method with high measurement accuracy such as using a CD-SEM as shown in FIG. 5 in the size measuring method, acquiring the measurement image 501 whose magnifications in the vertical direction and in the lateral direction are different and measuring the wire 502 to be measured with the length (L) 504 of the measurement region of 3 μm and the measurement intervals (ΔL) of 10 nm was adopted. In this method, it is possible to reduce the shrink amount S of the ArF resist by thinning the scanning intervals of electron beam. However, if the measuring method with low size accuracy as the conventional measuring method is used, calculation accuracy of the shrink S of the resist pattern also deteriorates, and it becomes difficult to produce a prediction model with high accuracy.

Furthermore, as a method for increasing the measurement accuracy, as shown in FIG. 17, there is a method which measures the same portion in measurement after lithography and in measurement after gate electrode processing and compares a profile ($W_{ADI}$) 1701 of a wire width measured after lithograph and a profile ($W_{AEI}$) 1702 of a wither width measured after gate electrode processing. As shown in FIG. 17A, first, a square sum of a difference (ΔW) 1703 between the wire widths of $W_{ADI}$ 1701 and $W_{AEI}$ 1702 is calculated. Next, as shown in FIG. 17B, a position where the square sum becomes minimum is obtained by moving a coordinate of X axis of $W_{ADI}$ 1701 or $W_{AEI}$ 1702 by a shift amount (ΔX) 1704. In an ordinary gate electrode processing step, a waveform of LER of the resist pattern is approximately transferred to LER of the gate electrode. Therefore, the shift amount 1704 where the square sum becomes the minimum is present necessarily. When the square mean value becomes the minimum, average values at a point present on the same measurement region 1705 at profiles of $W_{ADI}$ 1701 and $W_{AEI}$ 1702 are defined as a wire width L_G1 after lithography and a wire width $L\_G2_I$ after gate processing. The length of the measurement region 1705 may be 1 μm or more, preferably 2 μm or more, more preferably 3 μm or more. A function for minimizing a square sum of a difference between the two profiles and calculating a wire width at this time may be included in a measuring apparatus, and it may be performed in the data analyzing unit after image measurement. By conducting such an operation that the profiles of the wire widths after lithography and after gate processing coincide with each other, it is made possible to actually measure the wire widths at the same portion so that accuracy of the prediction model can be further improved. In order to remove influence of a shrink amount due to scanning of electron beam, shifting a scanning position of electron beam between that in measurement of a resist pattern and that in measurement of a wire width after gate processing is an effective method. In this method, the square mean method has been applied, but it is possible to apply another method.

Accuracy of a prediction model can be improved by using a measuring method with high measurement accuracy in the above manner, and further taking a parameter such as the shrink amount S of the resist pattern in the prediction model. And, by generating a control model from the prediction model with high accuracy and controlling a control process according to a proper condition, gate electrode processing with high size accuracy is realized, and as a result, productivity is improved.

Third Embodiment

Figure 18:
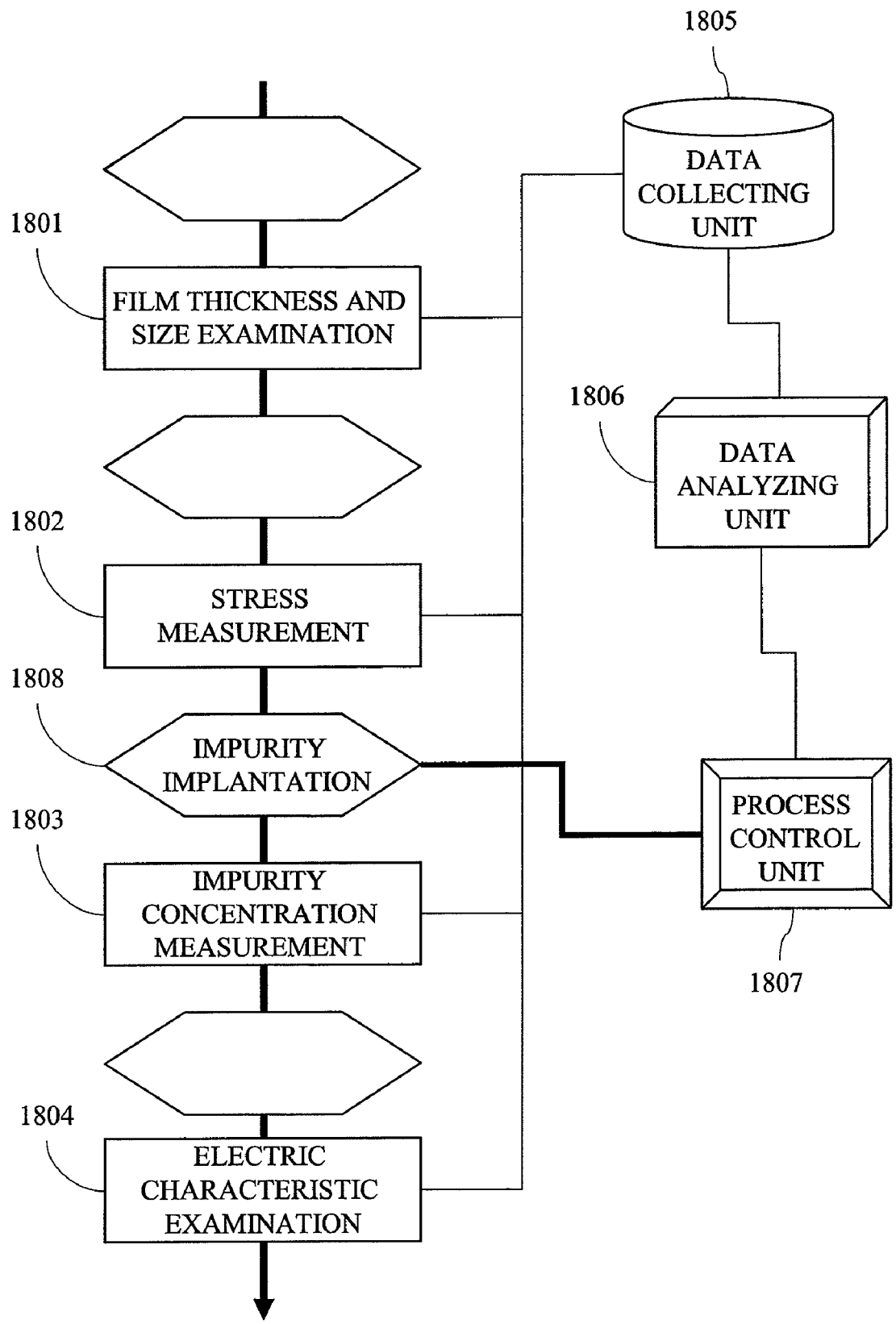
FIG. 18 is a diagram showing a control system for stabilizing electric characteristics in a third embodiment of the present invention.
Figure 19:
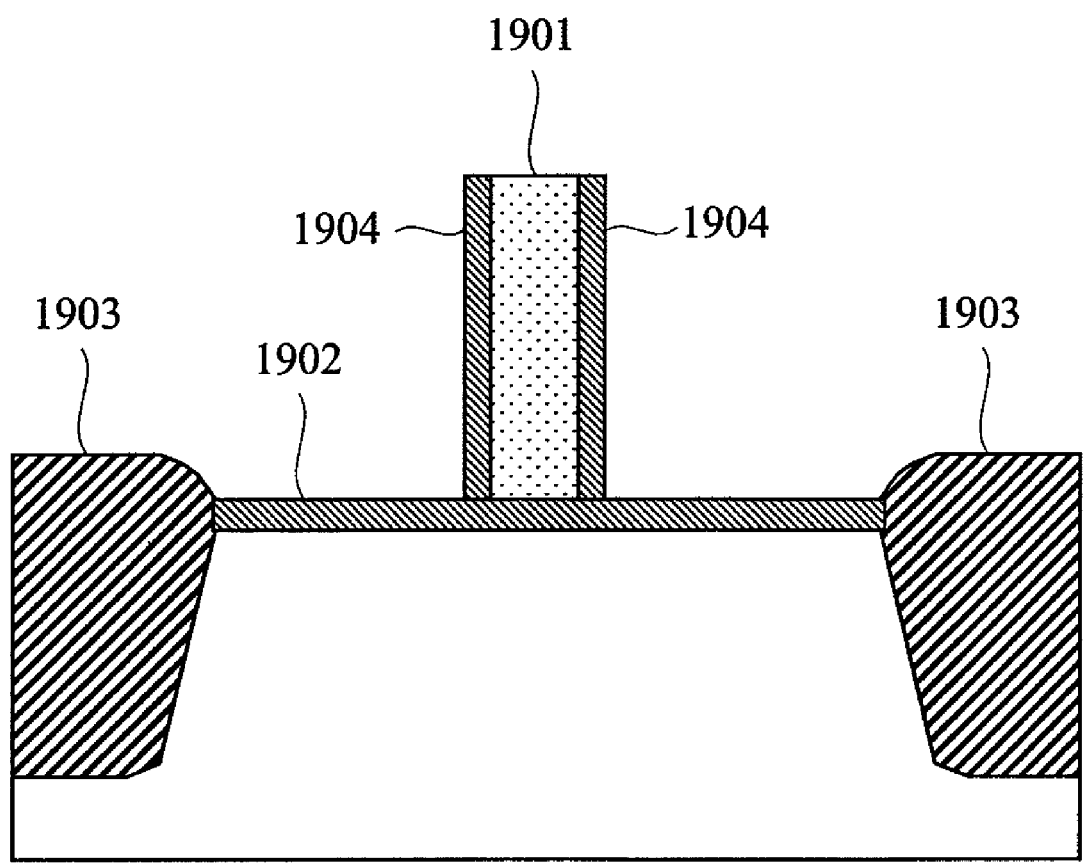
FIG. 19 is a sectional view showing a gate electrode in the third embodiment of the present invention.

A third embodiment of the present invention will be explained with reference to FIG. 18 and FIG. 19. FIG. 18 is a diagram showing a control system for electric characteristic stabilization, and FIG. 19 is a sectional view of a gate electrode, respectively.

In this embodiment, an example that the present invention has been applied for reducing fluctuation of electric characteristics of a semiconductor device, for example, fluctuation of a threshold voltage Vth, is described. As shown in FIG. 18, steps up to an electric characteristic examining step 1804 were performed. As the examining steps, a stress measuring step 1802, an impurity concentration measuring step 1803, an electric characteristic examining step 1804, and the like were performed in addition to the ordinary film thickness and size examining step 1801. For stress measurement of a thin film, a cathode luminescence method, Raman spectroscopy, or the like is generally used, but if a pattern for stress measurement is produced on a wafer, measurement by another method is possible. And, as shown in FIG. 19, a size of an offset spacer 1904 of a gate electrode 1901 is also set as one of examination items (reference symbol 1902 denotes a gate oxide film and 1903 denotes a device isolation layer). Examination data collected here were collected in a data collecting unit 1805, and a prediction model of electric characteristics is generated using the data in a data analyzing unit 1806. A control model for calculating a control parameter is generated from the prediction model. In a process control unit 1807, an impurity implanting step 1808 is set as a control process and an impurity amount is set as a control parameter. And, based upon the examination data from the manufacturing line, an impurity implanting amount serving as the control parameter from the control model is calculated, and the processing condition for the impurity implanting step constituting the control process is properly controlled, as a result, fluctuation of electric characteristic of a semiconductor device, for example, fluctuation of a threshold voltage Vth, could be reduced to 5 mV or less.

As explained in the respective embodiment, the present invention is directed to the control method of a manufacturing process of a semiconductor device, and it is effective means for reducing a measurement error to improve accuracy of a prediction model and a control model by setting a length (L) 504 of a measurement region at a size measurement at an examining step to at least 10 times a wire width W. Furthermore, by improvement of accuracy of the prediction model and the control model, it becomes possible to control the manufacturing process of a semiconductor device properly and it becomes possible to reduce a factor such as fluctuation of a discriminating parameter of a semiconductor device, for example, size fluctuation of a gate electrode or fluctuation of a threshold voltage Vth of electric characteristic, as a result, manufacture with high productivity of a semiconductor device can be realized. As shown in the embodiments, since the measuring method of a wire width to which the present invention has been applied is a very effective method for measuring a line pattern with large LER, accuracy of size management can be improved by applying the measuring method to the size management.

The present invention which has been made by the inventors has been specifically explained based upon the embodiments above, but the present invention is not limited to the embodiments and it may be modified variously without departing from the scope and spirit of the present invention.

The present invention relates to a manufacturing technique of a semiconductor device, and in particular to a technique suitable for application to a size measuring method of a wire width in control method for a manufacturing process of a semiconductor device. Further, the present invention can be applied to a manufacturing process of a device that manufactures a device using a technique similar to a manufacturing method of a semiconductor device such as MEMS (Micro Electro Mechanical Systems) or CCD (Charge Coupled Devices).

What is claimed is:

1. A manufacturing method of a semiconductor device, including: a plurality of processing steps of working a semiconductor device, said plurality of processing steps including at least a step of film depositing and a step of lithography, and a plurality of examining steps of examining results of working at the processing steps, said plurality of examining steps including examining a plurality of layers formed in said plurality of processing steps, the method further comprising:
   a step of collecting examination data generated at the examining of the plurality of layers;
   a step of analyzing the examination data for the plurality of layers;
   a step of generating a prediction model of a parameter from the examination data of the plurality of layers to at least one parameter previous to lithography of discriminating parameters of the semiconductor device;
   a step of utilizing, as a control process, at least one processing step of the plurality of processing steps to generate a control model for determining at least one set value of a processing condition for the control process in order to stabilize the parameters of the semiconductor device;
   a step of calculating a set value of the processing condition for the control process from the examination data of the plurality of layers based upon the control model;
   a step of changing the processing condition for the control process based upon the calculated set value; and
   a step of examining a wire width,
   wherein an average value of local line widths, in a lateral direction of the wiring, within a measurement region having a length in a wiring direction set to be 1 µm or more and 6 µm or less, is measured as a measurement result with respect to a wiring having a wiring width of 100 nm or less from an image obtained by a Critical Dimension-Scanning Electron Microscope (CD-SEM) at a magnification of 150,000 times or less in a length direction of the wiring.

2. The manufacturing method of a semiconductor device according to claim 1, comprising:
   a step of calculating a step between an active region and a device isolation region which is a discriminating size of the semiconductor device from examination data at a plurality of examining steps,
   wherein the step between the active region and the device isolation region is set as one of parameters of the prediction model.

3. The manufacturing method of a semiconductor device according to claim 1, comprising:
   a step of examining a resist pattern using a Critical Dimension-Scanning Electron Microscope,
   wherein a shrink amount of the resist pattern is set as one of parameters of the prediction model.

4. The manufacturing method of a semiconductor device according to claim 1,
   wherein either of pattern occupancy, a processing time after maintenance of an apparatus, a processing order of a wafer to be processed, and a wafer placing position in a batch processing apparatus for a wafer to be processed is used as one of variables of the prediction model.

5. The manufacturing method of a semiconductor device according to claim 1,
   wherein size measurement data used in generation of the prediction model is measured using the Critical Dimension-Scanning Electron Microscope and a scatterometer and size measurement data measured by the scatterometer is used in determination of a control parameter.

6. The manufacturing method of a semiconductor device according to claim 1, the method further comprising a step of calculating a shallow trench isolation (STI) step between an active region and a device isolation region from a result of a thickness measurement after an STI etching step, a result of a thickness measurement after a chemical mechanical polishing (CMP) step, and a result of a thickness measurement after a step of removing silicon nitride (SiN), wherein
   a model for predicting a size of a resist pattern after etching is built using a size of a resist pattern, a measurement result of a thickness of poly-Si, and a calculation result of the STI step; and
   a working size after etching is stabilized by controlling processing conditions of an etching step by Feed Forward control according to a size after etching predicted using inspection data before the etching step.

7. The manufacturing method of a semiconductor device according to claim 1, wherein
   the wire width is measured from an image obtained using an image acquisition function having variable magnification in a vertical direction and the lateral direction (rectangular scan function) at a magnification in the lateral direction of 150,000 times or more.

8. The manufacturing method of a semiconductor device according to claim 1, wherein
   a graph of the wiring direction of the local wire width before the processing step and a graph of the wiring direction of the local wire width after the processing step are compared, and a position of the measurement region after the processing step is controlled so that an error between a position of the measurement region before the processing step and a position of the measurement region after the processing step is 10 nm or more and 500 nm or less.

9. The manufacturing method of a semiconductor device according to claim 1, wherein in the step of measuring the wire width, a means of measuring the wire width provides a graph of the local wire width in the wiring direction and determines the length of the measurement region of the wire width so that a measurement variation is 1 nm or less.

10. The manufacturing method of a semiconductor device according to claim 1, wherein parameters of the control model are subjected to feedback control using a difference between measurement data of the wire width after process control and a defined value of the wire width.

* * * * *